US009642241B2

(12) United States Patent
Huitema et al.

(10) Patent No.: US 9,642,241 B2
(45) Date of Patent: May 2, 2017

(54) OPTIMAL MOUNTING OF A FLEXIBLE DISPLAY

(71) Applicant: POLYERA CORPORATION, Skokie, IL (US)

(72) Inventors: Hjalmar Edzer Ayco Huitema, Belmont, CA (US); Kwok Wah Mok, Valkenswaard (NL)

(73) Assignee: Flexterra, Inc., Skokie, IL (US)

( * ) Notice: Subject to any disclaimer, the term of this patent is extended or adjusted under 35 U.S.C. 154(b) by 10 days.

(21) Appl. No.: 14/947,450

(22) Filed: Nov. 20, 2015

(65) Prior Publication Data

US 2016/0081180 A1    Mar. 17, 2016

Related U.S. Application Data

(63) Continuation of application No. PCT/US2015/022691, filed on Mar. 26, 2015.

(60) Provisional application No. 61/971,100, filed on Mar. 27, 2014.

(51) Int. Cl.
| | | |
|---|---|---|
| H05K 1/02 | (2006.01) | |
| G04G 17/04 | (2006.01) | |
| G04G 17/08 | (2006.01) | |
| G06F 1/16 | (2006.01) | |
| G09F 9/30 | (2006.01) | |
| H01L 51/00 | (2006.01) | |
| H01L 51/56 | (2006.01) | |
| H05K 1/03 | (2006.01) | |
| H05K 7/02 | (2006.01) | |
| H05K 13/04 | (2006.01) | |

(52) U.S. Cl.
CPC ......... *H05K 1/0271* (2013.01); *G04G 17/045* (2013.01); *G04G 17/08* (2013.01); *G06F 1/16* (2013.01); *G06F 1/163* (2013.01); *G06F 1/1652* (2013.01); *G09F 9/30* (2013.01); *H01L 51/0097* (2013.01); *H01L 51/56* (2013.01); *H05K 1/028* (2013.01); *H05K 1/0274* (2013.01); *H05K 1/0306* (2013.01); *H05K 7/02* (2013.01); *H05K 13/04* (2013.01); *G09F 9/301* (2013.01); *H01L 2251/5338* (2013.01); *Y02E 10/549* (2013.01)

(58) Field of Classification Search
CPC ..... G06F 1/163; G06F 1/1652; G04G 17/045; G04G 17/08
See application file for complete search history.

(56) References Cited

U.S. PATENT DOCUMENTS 9,510,470 B2 * 11/2016 Huitema ............... G06F 1/1652
2006/0132025 A1 * 6/2006 Gao ....................... H01L 51/52
313/503

(Continued)

*Primary Examiner* — Adrian S Wilson
(74) *Attorney, Agent, or Firm* — Karen K. Chan

(57) ABSTRACT

A method for mounting a flexible electronics component to a support structure includes bending the flexible electronics component to be aligned with a curved contour. The curved contour is determined based on a flexibility requirement of a product in which the flexible electronics component is to be integrated and one or more flexibility constraints of the flexible electronics component. The method also includes bending the support structure to be aligned with the curved contour, and adhering the bent flexible electronics component to the bent support structure to produce a flexible electronics assembly.

20 Claims, 14 Drawing Sheets

(56) References Cited

U.S. PATENT DOCUMENTS

| | | | |
|---|---|---|---|
| 2006/0209218 A1* | 9/2006 | Lee | G04G 9/00 349/1 |
| 2006/0238494 A1* | 10/2006 | Narayanaswami | G06F 3/002 345/156 |
| 2006/0273304 A1* | 12/2006 | Cok | H01L 51/0096 257/40 |
| 2007/0205997 A1* | 9/2007 | Lieshout | G02F 1/133305 345/204 |
| 2007/0279852 A1* | 12/2007 | Daniel | A44C 5/0007 361/679.03 |
| 2008/0291225 A1* | 11/2008 | Arneson | G06F 3/011 345/698 |
| 2009/0251888 A1* | 10/2009 | Douglas | A44C 5/0015 362/103 |
| 2010/0238612 A1* | 9/2010 | Hsiao | G02F 1/133305 361/679.01 |
| 2011/0043976 A1* | 2/2011 | Visser | G09F 9/00 361/679.01 |
| 2011/0122593 A1* | 5/2011 | van Lieshout | G02F 1/133305 361/807 |
| 2011/0187681 A1* | 8/2011 | Kim | G06F 1/1652 345/204 |
| 2011/0227855 A1* | 9/2011 | Kim | G02F 1/13306 345/173 |
| 2012/0007796 A1* | 1/2012 | Jokinen | H05K 1/189 345/156 |
| 2012/0283799 A1* | 11/2012 | Fan | A61N 1/0543 607/54 |
| 2012/0314546 A1* | 12/2012 | Brewer | G04G 17/04 368/281 |
| 2013/0044215 A1* | 2/2013 | Rothkopf | G06F 1/163 348/143 |
| 2013/0076612 A1* | 3/2013 | Myers | G06F 1/1626 345/156 |
| 2013/0120106 A1* | 5/2013 | Cauwels | G06F 1/163 340/3.1 |
| 2013/0235008 A1* | 9/2013 | Kwon | G09G 3/20 345/204 |
| 2015/0378391 A1* | 12/2015 | Huitema | G06F 1/163 361/679.03 |
| 2016/0014919 A1* | 1/2016 | Huitema | G06F 1/1652 313/511 |

* cited by examiner

OPTIMAL MOUNTING OF A FLEXIBLE DISPLAY

CROSS-REFERENCE TO RELATED APPLICATIONS

This application is a continuation of International Patent Application No. PCT/US2015/022691, filed Mar. 26, 2015, which claims priority to and the benefit of the filing date of U.S. Provisional Patent Application Ser. No. 61/971,100, which was entitled "Optimal Mounting of a Flexible Display" and filed on Mar. 27, 2014 (Ref. No.: 32187/48290P). The entire disclosure of each of these applications is hereby expressly incorporated by reference herein for all uses and purposes.

Further, this application is related to commonly-owned International Patent Application No. PCT/US14/72328, entitled "SUPPORT STRUCTURES FOR A FLEXIBLE ELECTRONIC COMPONENT," filed Dec. 24, 2014, the entire disclosure of which is hereby incorporated by reference herein.

TECHNICAL FIELD

This patent application relates generally to flexible electronic components, and more particularly, to flexible electronic components optimally mounted on support structures so as to meet product flexibility requirements.

BACKGROUND

Typically, flexible electronic components, such as flexible electronic displays (or simply "flexible displays"), are manufactured on a flat surface. As a result, when flexed or bent, flexible displays have a certain strain profile or distribution including a neutral line of zero strain. The outer radius of the display will be under tension, while the inner radius of the display will be under compression. At some location in the layer stack is the neutral plane (or neutral line in a two dimensional cross sectional representation) along which there is no tension or compression upon bending. If a curvature of bending a flexible display is too high, the strain in the display can cause certain brittle inorganic layers, or other layers in a stack of display components, to buckle or crack. Such buckling or cracking is intolerable for a retail product, or other application of a flexible display demanding reliability and consistent performance.

In many product applications, flexible electronic components need to have a mechanical support structure (a plastic sheet, thin metal sheet, or a more complex structure) that guides movement of the display during use. This movement guidance is necessary to prevent a user from bending the display beyond its minimum radius, bending the display in more than one direction, or causing defects in display. However, when a support structure is attached to a flexible display, the neutral plan of the resulting assembly is often shifted from its location in the flexible display. Such a shift can increase the minimum bending radius of the flexible display, and, as a result, flexible displays in practical product assemblies have limited flexibility (e.g., a minimum bending radius of 20 to 50 centimeters). Achieving supported flexing at a smaller bent radius (e.g., 0.3 to 10 centimeters) is problematic.

SUMMARY

A flexible electronics assembly, such as an assembly including a flexible display component and a support structure component, maintains a pre-defined strain distribution or profile that allows the flexible electronics assembly to comply with product flexibility requirements. The flexible electronics assembly includes a bent flexible electronics component adhered to a bent support structure component, where the bent flexible electronics component is bent to a curved contour separate from the bent support structure component and prior to being adhered to the support structure component. In this manner, the flexible electronics assembly allows the flexible electronics component to flex, without buckling or cracking, to radii of curvature that would not be possible if the flexible electronics component and support structure component were adhered to each other in a flat state.

In an embodiment, a method for mounting a flexible electronics component to a support structure comprises bending the flexible electronics component to be aligned with a curved contour. The curved contour is determined based on a flexibility requirement of a product in which the flexible electronics component is to be integrated and one or more flexibility constraints of the flexible electronics component. The method further comprises bending the support structure to be aligned with the curved contour, and adhering the bent flexible electronics component to the bent support structure to produce a flexible electronics assembly. The flexible electronics assembly maintains a strain distribution compliant with the one or more flexibility constraints of the flexible electronics component when flexed according to the flexibility requirement of the product.

In another embodiment, a flexible electronics assembly comprises a flexible electronics component and a support structure component fixedly adhered to the flexible electronics component to constrain flexing of the flexible electronics component to within one or more flexing boundaries so as to prevent damage to one or more critical layers of the flexible electronics display. The support structure component is adhered to the flexible electronics component by: (i) bending the flexible electronics component to be aligned with a curved contour, the curved contour determined based on a flexibility requirement of a product in which the flexible electronics is to be integrated and the one or more flexing boundaries of the flexible electronics component, (ii) bending the support structure component to be aligned with the curved contour, and (iii) adhering the bent flexible electronics component to the bent support structure component to produce the flexible electronics assembly.

DETAILED DESCRIPTION

Figure 1A:
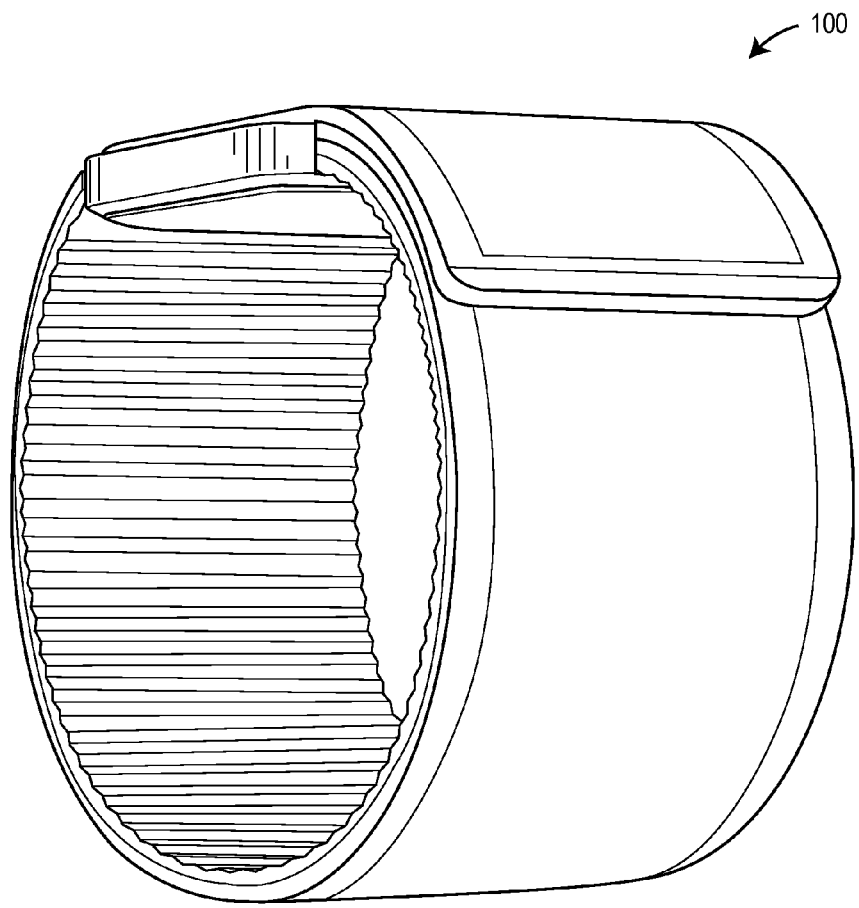
FIG. 1A is a perspective view of an example article in which a flexible electronics assembly, such as a flexible display assembly, may be integrated.

A flexible electronics assembly, such as an assembly including a flexible display component and a support structure component, maintains a pre-defined strain distribution or profile that allows the flexible electronics assembly to comply with product flexibility requirements. The flexible electronics assembly may include a bent flexible display component adhered to a bent support structure component, where the bent flexible display component is bent to a curved contour separate from the bent support structure component and prior to being adhered to the support structure component. In this manner, the flexible electronics assembly allows the flexible display component to flex, without buckling or cracking, to bending radii or radii of curvature that would not be possible if the flexible display component and support structure component were adhered to each other in a flat state.

A wearable computing or communication device or wearable article, such as a smartwatch, may integrate the flexible electronics assembly, such that the flexible electronics assembly is dynamically bendable or conformable to a user's wrist, arm, or other curved or flat surface. For example, a flexible wristband or smartwatch integrating the flexible electronics assembly may display images, data, maps, calendars, social media information, etc. via the flexible electronics assembly, while maintaining flexibility of the wristband to relatively high bending radii (with respect to a flat state). Devices integrating the flexible electronics assembly may also be easily attached to other items, such as mugs, cups, computers, phone covers, bike handles, automobile dashboards, stands, etc., enabling the flexible electronics assembly to be operated "hands-free."

Generally, however, it is understood that flexible electronics assemblies or flexible display assemblies discussed herein may be integrated into any type of wearable or non-wearable computing, communication, or other mobile device and, in some cases, may be utilized as a standalone display devices communicatively connected to an external computing or communication device. Further, although flexible electronics assemblies including flexible displays are given as examples throughout this description, it is understood that flexible electronics assemblies may include any suitable combination of flexible electronics components other than flexible displays, such as flexible Light Emitting Diode (LED) lighting panels, solar panels, keyboards, pressure sensors, microphones, motion sensors, health or activity monitoring devices, cameras, computer-readable media, etc., mounted to a support structure component. In some cases when the flexible electronics component is a flexible display, the flexible display may be a flexible electrophoretic display (EPD), a flexible Light Emitting Diode (LEDs) display, a flexible electrowetting display, or a flexible LCD.

Flexible Article with Flexible Electronics Component and Support Structure Component FIGS. 1A, 1B, 1C, and 1D illustrate an example flexible, attachable article 100, such as a smartwatch or bracelet type computing or communication device. The article 100 may include a flexible electronics components, or an example flexible display component 104. The article may also include an interlayer 106 and a support structure component 108, further details of which are described in U.S. Provisional Patent Application No. 61/946,412 (Attorney Docket No. 32187/47980P), filed Feb. 28, 2014, and entitled "SUPPORT STRUCTURE FOR A FLEXIBLE DISPLAY COMPONENT," the disclosure of which is hereby expressly incorporated by reference herein.

The flexible display component 104 is a flexible electronic display that is dynamically bendable or conformable to a surface, object, or device, though in other embodiments the flexible display component can be a collapsible e-reader, roll-out screen, OLED light, or other electronic component. The flexible display component 104 can be manufactured as any type of flexible display, such as an e-paper display, an organic light-emitting diode (OLED) display, etc., further details of which are discussed with reference to FIG. 2 and described in commonly owned U.S. Provisional Patent Application 61/920,705, filed Dec. 24, 2013 and entitled "DYNAMICALLY FLEXIBLE, ATTACHABLE DEVICE HAVING AN INTEGRAL FLEXIBLE DISPLAY," the disclosure of which is hereby expressly incorporated by reference herein.

Once manufactured, the flexible display component 104 can be configured for flexing, curving, or bending in an inward direction (i.e., the flexible display component 104 has a convex shape) and/or outward direction (i.e., the flexible display component 104 has a concave shape). As is known in the art, the flexible display component 104 has a minimum bending radius, which is based on the details surrounding the manufacture of and a materials stack used in the flexible display component 104. When the flexible display component 104 is flexed, curved, or bent beyond this minimum bending radius, one or more layers of the display 104 can delaminate, buckle, or crack, or otherwise be damaged causing damage to the display 104.

Figure 1B:
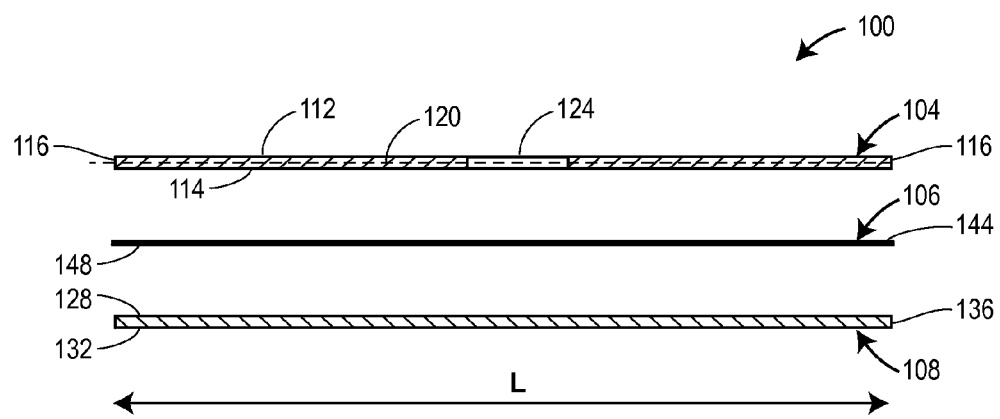
FIG. 1B is an exploded view of the components of the example article generally depicted in FIG. 1A.

As shown in FIG. 1B, the flexible electronic display 104 has a top side 112, a bottom side 114, and a pair of opposing ends 116. The flexible display component 104 also has a neutral plane 120, where there is no tension or compression upon bending. In this example, the neutral plane 120 of the display 104 is located approximately halfway between the top side 112 and the bottom side 114. Thus, when the flexible display component 104 is flexed, curved, or bent, points above or below the neutral plane 120 will be subject to tension or compression, while points that lie in or along the neutral plane 120 will not experience any tension or compression. In other examples, the neutral plane 120 of the display 104 can be located elsewhere, e.g., closer to the top side 112, due to, for example, a top substrate that is much thicker than the other layers in the display 104.

The flexible display component 104 also includes an electronics module 124 that is disposed between the ends 116 and holds electronics, such as processors, memories, sensors, batteries, display drivers, etc. that are used to power and drive the flexible display component 104 and to provide other communication functionality for the device 100. It will be appreciated that the electronics module 124 can be positioned elsewhere in other examples, such as, for example, disposed on the flexible display component 104. If desired, the components of the electronics module 124 can be sealed or otherwise protected from water, air, dirt, etc. to which the exterior of the device 100 is exposed. For example, any or all of these electronic components may be encapsulated in a hermetically sealed manner to prevent any direct exposure of these components to exterior forces and environmental hazards. Further details of an example electronics module are included with reference to FIG. 9.

To prevent the flexible display component 104 from being bent or curved beyond its minimum bending radius, the article 100 includes the support structure component 108, which is coupled to the flexible display component 104. The support structure component 108 is configured to limit local bending of the flexible display component 104 beyond one or more flexibility constraints, such as a minimum bending radius, while still meeting flexibility requirements of the article 100. The support structure component 108 can limit local bending of the flexible display component 104 in one direction (e.g., an inward or an outward direction) or in both directions (i.e., an inward and outward direction). Further, flexibility constraints of a flexible electronics/display component, according to which a support structure component is configured, may include asymmetric or biased bending ranges of a flexible electronics component. For example, the flexible display component 104 may, due to properties of one or more "critical" layers of flexible display component 104, bend to a radius of 5 mm to one side of a flat state (without damage to the critical layers, such as brittle inorganic layers) and only to a radius of 8 mm to another side of the flat state.

As shown in FIG. 1B, the support structure component 108 has a top side 128, a bottom side 132, a pair of opposing ends 136, and a length L measured from one end 136 to the other end 136. The stiffness of the support structure component 108 can vary, depending on the material(s) used to manufacture the support structure component 108 and/or the thickness of the support structure component 108. As one of ordinary skill in the art will appreciate, different materials have different Young's moduli. The support structure component 108 can, for example, be made of a bendable metal (e.g., brass, aluminum, copper, steel, tin, nickel), which tends to have a higher Young's modulus, or a plastic, rubber, foam, a visco-elastic material, or other suitably flexible material, which may have a lower Young's modulus than the bendable metal. Alternatively, the support 108 can be made of rigid parts (e.g. thicker plastic, metal) that can hinge with respect to each other.

As shown in FIG. 1B, the interlayer 106 has a top side 144 and a bottom side 148. The interlayer 106 can be or include one or more un-patterned and/or patterned layers, such as, for example, one or more layers of foam, rubber, visco-elastic, adhesive, other suitable material(s), or combinations thereof.

Figure 1C:
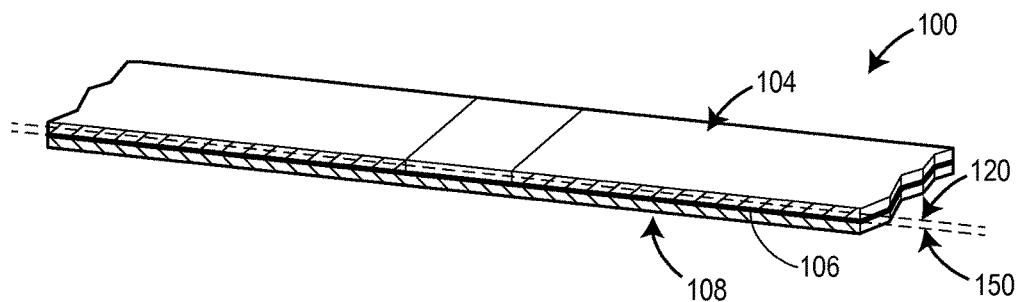
FIG. 1C is a perspective view of a flat state of the components of the example article generally depicted in FIG. 1A.
Figure 1D:
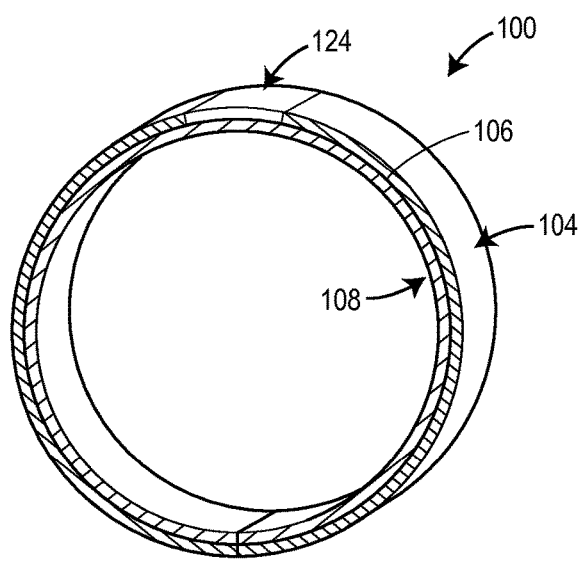
FIG. 1D is a perspective view of a flexed, or bent, state of the components of the example article generally depicted in FIG. 1A.

The article 100 can also include a connection structure that functions to connect the ends 136 of the support structure component 108 together when the article 100 is bent, as illustrated in FIG. 1D, to form a circular or oval band. In some embodiments, the connection structure can be a magnetically-based connection structure, such as, for example, a connection structure in the form of magnets disposed within the support structure component 108 at or proximate to the ends 136, magnets disposed at the ends 136 so that the ends 136 connect end-to-end, or magnets disposed on the top or bottom sides 128, 132 at or proximate to the ends 136 so that the article 100 can be folded around on itself so as to create an article of variable length. One or more mechanical connectors (e.g., buckles, snap components, clasps, cooperating grooves and projections, cooperating tabs and recesses), any desired hook and loop connection material (e.g., Velcro), or some other connection means can be used instead of or in addition to the magnetically-based connection structure. These and other connection structures are described in further detail in commonly owned U.S. Provisional Patent Application 61/920,705, filed Dec. 24, 2013 and entitled "DYNAMICALLY FLEXIBLE, ATTACHABLE DEVICE HAVING AN INTEGRAL FLEXIBLE DISPLAY," the disclosure of which is hereby expressly incorporated by reference herein.

As shown in FIG. 1C, the interlayer 106 is disposed between the flexible display 104 and the flexible support 108. Specifically, the top side 144 of the inter layer 106 is coupled (e.g., attached, adhered) to the bottom side 114 of the display 104, and the top side 128 of the flexible support 108 is coupled (e.g., attached, adhered) to the bottom side 148 of the inter layer 106. In some cases, the interlayer 106 only serves to couple portions or segments of the display 104 to corresponding portions or segments of the flexible support 108.

In this example, the flexible display 104 is disposed over and spans the entire length of the inter layer 106 and the flexible support 108, such that the flexible display 104 extends between the ends of the article 100 and is viewable from the top of the article 100. In other examples, the flexible display 104 may only be disposed over and span a partial length of the flexible support 108 and/or may be disposed under the flexible support 108.

As such, the inter layer 106 not only mechanically couples the display 104 to the flexible support 108, but can reduce, or even eliminate, the local variations in the bending radius of the article 100. In other words, the inter layer 106 can serve to smoothen out any local variation in the bending of the article 100, particularly the local variation of any bending experienced by the flexible display 104, thereby providing a more continuous local bending radius when the article 100 is curved or bent. Advantageously, in some cases, the inter layer 106 can also provide visco-elastic cushioning to the display 104, thereby making the display 104 less sensitive (e.g., less prone to damage) to objects dropped thereon.

It is appreciated that the article 100, or any of the other articles described herein, need not include the inter layer 106, or any layer disposed between the flexible display 104 and the flexible support 108. Instead, the flexible display 104 and the flexible support 108, and/or any of the other flexible supports described herein, can be directly coupled (e.g., attached, adhered) to one another in any known manner.

With the article 100 assembled in this way, the flexible support 108 is configured to support the flexible display 104 and limit local bending of the flexible display 104 beyond its bending range when the article 100 is curved or bent (e.g., to the curved position shown in FIG. 1D).

Flexible Display Component

Figure 2:
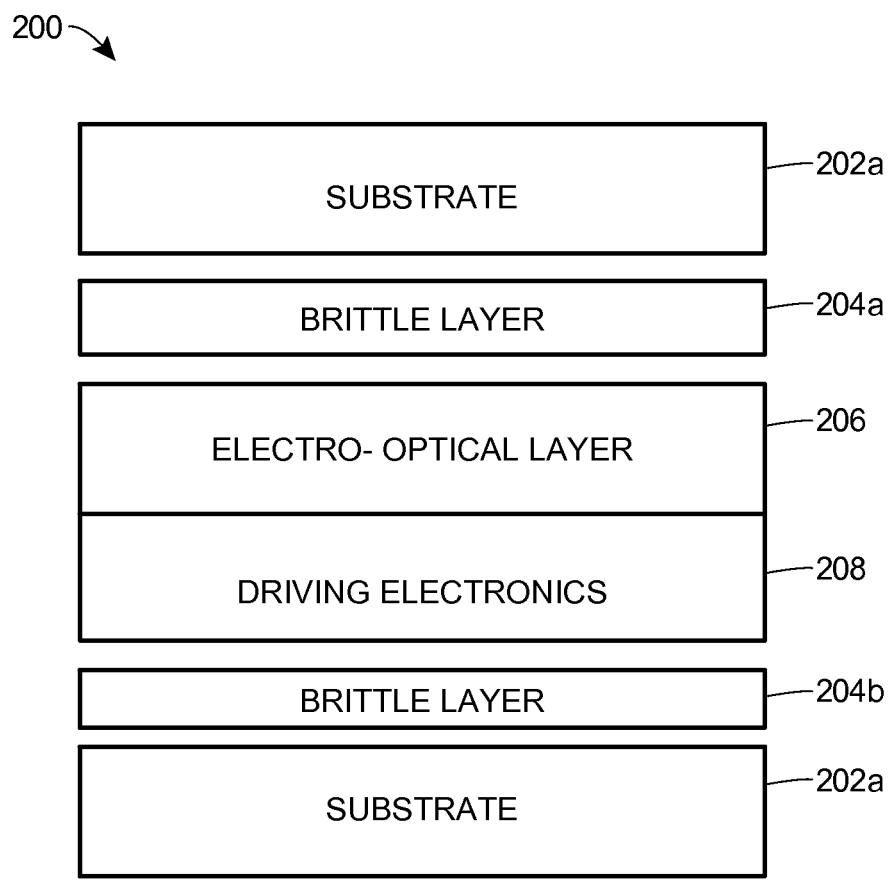
FIG. 2 is a block diagram of an example display stack for a flexible display component, such as the flexible display component illustrated in FIGS. 1B, 1C, and 1D.

FIG. 2 is a block diagram of an example layer stack of a flexible display component 200, or simply "flexible display" that may be part of a flexible electronics assembly or flexible article, such as the flexible article 100. The flexible display component 200 includes a plurality of layers in a display "stack," where each of the plurality of layers may include a variety of materials different from materials in other of the plurality of layers and may serve a specific purpose different from other of the plurality of layers.

In particular, the flexible display component 200 may include one or more flexible substrate layers 202a and 202b. The flexible substrates 202a may be configured to cover or adhere to a frontplane display area (e.g., an area on which images may be displayed), and the flexible substrate 202b may be configured to cover or adhere to a backplane display area (e.g., opposite the area on which images may be displayed). Materials suitable for use as the flexible substrates 202a and 202b for either the frontplane and/or the backplane include, but are not limited to, various plastic substrates such as polyimide, polyethylene terephthalate (PET), polycarbonate, polyethersulfone, polyether ether ketone (PEEK), and polyethylene naphthalate (PEN). Metallic foils or thin glass also may be used.

The flexible display component 200 further includes one or more brittle layers 204a and 204b adjacent to the substrate layers 202a and 202b. The brittle layers 204a and 204b may be inorganic, in an implementation, and may be a layer stack including planarization or plastic layers. For example, the brittle layers 202a and 202b may include inorganic materials capable of withstanding approximately one percent strain without buckling or cracking, depending on an amount of built-in stress due to manufacturing process conditions. In the case of a display, at least one of the brittle layers 204a and 204b may include a transparent electrode layer including a transparent conductive oxide such as indium tin oxide (ITO).

Adjacent to the brittle layer 204a, the flexible display component may include an electro-optical layer 206. The example electro-optical layer 206 may be printed, deposited, or otherwise attached to the flexible substrate layer 202a and the brittle layer 204a. The electro-optical layer may be capable of displaying an image upon energization (e.g., upon voltages being applied across the electro-optical layer 206). For example, the electro-optical layer may include organic light-emitting material having a stacked structure itself including a plurality of different organic layers.

In the case of an e-paper display, the electro-optic layer 206 may be composed of an encapsulated electrophoretic medium. The encapsulated electrophoretic medium generally includes numerous small capsules, each of which itself includes an internal phase containing electrophoretically-mobile (e.g., black and/or white) particles suspended in a liquid suspending medium, and a capsule wall surrounding the internal phase. Typically, the capsules are themselves held within a polymeric binder to form a coherent layer positioned between two electrode layers. Most commonly, one electrode layer has the form of a single continuous electrode, while the other electrode layer is patterned into a matrix of pixel electrodes, each of which defines one pixel of the display. Electronic charges are applied to the capsules to bring particles of a selected color to the surface. Electrophoretic media and related display device structures are described in, for example, U.S. Pat. No. 5,930,026; U.S. Pat. No. 6,831,769; U.S. Pat. No. 6,839,1208; and U.S. Pat. No. 7,170,670, the disclosure of each of which is incorporated by reference herein in its entirety for all purposes. In addition to electrophoretic displays, other e-paper display technologies include electrowetting displays, and electrofluidic displays as described in, for example, U.S. Pat. No. 7,446,945 and U.S. Pat. No. 8,111,465, the disclosure of each of which is incorporated by reference herein in its entirety for all purposes.

Still further, the flexible electronics assembly 200 may include a driving electronics layer 208 between the electro-optical layer 206 and the brittle layer 204b. The driving electronics layer may include an array of thin film transistors (TFTs) printed, etched, deposited, or otherwise attached to the flexible substrate layer 202b and the brittle layer 204b. The TFT array may include switching and/or driving TFTs, and additional elements such as storage capacitors, and interconnect wiring. An individual TFT element generally is made by successive deposition and patterning of conductor (i.e., source, drain, and gate electrodes), insulator (i.e., dielectric) and semiconductor thin film layers. The active semiconductor layer can be composed of either organic (small-molecule or polymeric semiconductors) or inorganic materials (such as amorphous silicon, low-temperature polycrystalline silicon, graphene, carbon nanotube, and metal oxide semiconductors).

The TFT array may preferably comprise organic TFTs (OTFTs) based upon an organic semiconductor described in at least one of U.S. Pat. No. 6,2085,914; U.S. Pat. No. 6,608,323; U.S. Pat. No. 6,991,749; U.S. Pat. No. 7,374,702; U.S. Pat. No. 7,528,176; U.S. Pat. No. 7,2069,693; U.S. Pat. No. 7,605,225; U.S. Pat. No. 7,671,202; U.S. Pat. No. 7,816,480; U.S. Pat. No. 7,842,198; U.S. Pat. No. 7,892,454; U.S. Pat. No. 7,893,265; U.S. Pat. No. 7,902,363; U.S. Pat. No. 7,947,837; U.S. Pat. No. 7,982,039; U.S. Pat. No. 8,022,214; U.S. Pat. No. 8,329,855; U.S. Pat. No. 8,404,844; U.S. Pat. No. 8,440,828; U.S. Patent Publication No. 2010/0252112; U.S. Patent Publication No. 2010/0283047; U.S. Patent Publication No. 2010/0326527; U.S. Patent Publication No. 2011/01205208; U.S. Patent Publication No. 2011/0136333; and U.S. Patent Publication No. 2013/0062598, the disclosure of each of which is incorporated by reference herein in its entirety for all purposes. While OTFTs may include metallic contacts and a dielectric layer composed of silicon oxide ($SiO_2$) or another inorganic oxide or nitride (such as $Al_2O_3$, $HfO_2$, or $Si_3N_4$), a dielectric layer composed of an electrically insulating polymer may be preferred. Exemplary polymeric dielectric materials include polyacrylates, polyimides, polyvinyl alcohol, polystyrene, polyester, polycarbonate, polyhaloethylene, epoxy resins, siloxane polymers, benzocyclobutene-based polymers. Other polymeric dielectrics are described in U.S. Pat. No. 7,605,394; U.S. Pat. No. 7,981,989; U.S. Pat. No. 8,093,2088; U.S. Pat. No. 8,274,075; U.S. Pat. No. 8,338,555; U.S. Patent Publication No. 2011/01720089; U.S. Patent Publication No. 2011/0215334; and U.S. Patent Publication No. 2012/0068314. Conductive polymers such as poly(3,4-ethylenedioxythiophene) poly(styrenesulfonate) (PEDOT:PSS) may be used as alternative materials for metallic contacts in OTFTs.

Preferably, the TFT array may comprise metal oxide TFTs based upon a metal oxide semiconductor. For example, the metal oxide semiconductor can be selected from various mixed oxides including one or more of indium, zinc, tin, and gallium such as indium zinc oxide (IZO), zinc tin oxide (ZTO), indium gallium oxide (IGO), and indium gallium zinc oxide (IGZO). In a more preferred embodiment, the TFT array may comprise IGZO TFTs. While state-of-the art IGZO TFTs usually include thick layers of inorganic materials such as $SiO_2$, $SiO_x$, $Si_3N_4$, and $SiO_xN_y$ as dielectric and passivation layers, it is preferred that if the TFT array backplane comprises metal oxide TFTs, organic materials are used in at least some of the dielectric and passivation layers, such that the thickness of the remaining inorganic layer(s) may be reduced to allow maximum flexibility of the TFT array as whole. Metal oxide TFTs incorporating one or more organic layers are described in U.S. Pat. No. 8,017, 4208; U.S. Pat. No. 8,097,877; U.S. Pat. No. 8,395,1200; and U.S. Patent Publication No. 2012/0223314, the disclosure of each of which is incorporated by reference herein in its entirety for all purposes.

In some scenarios, the plurality of layers of the flexible electronics assembly 200 may be laminated or otherwise secured together. The flexible substrate layer 202a, the brittle layer 204a, and the electro-optical layer 206 may be produced by forming a subassembly that includes the layers 202a, 204a, and 206 in sequence. Optionally, such a subassembly may include an adhesive layer to allow lamination to the remaining layers 208, 204b, and 202b. In addition to one or more emissive layers, the stacked structure may include additional layers such as a hole-injection layer, a hole-transport layer, an electron-transport layer, a hole-blocking layer, and/or an electron-blocking layer to enhance device performance. Individual OLED elements may have different emitters (for example, a red emitter, a green emitter, or a blue emitter) in their emissive layer to provide a colored image. Exemplary OLED device structures and materials are described in U.S. Pat. Nos. 5,707,745, 5,844,363, 6,097,147, 6,303,238, and 8,334,545, the disclosure of each of which is incorporated by reference herein in its entirety for all purposes.

To integrate a subassembly of the flexible substrate layer 202a, the brittle layer 204a, and the electro-optical layer 206 (e.g., frontplane components) with the flexible substrate layer 202b, the brittle layer 204b, and the driving electronics layer 208 (e.g., backplane components) for a completed display system, the bottom of the electro-optical layer 206 may be connected to the bottom or pixel electrode of the driving electronics layer 208. The bottom or pixel electrode of the driving electronics layer 208 may then be connected to the drain or source electrode of the switching TFT (e.g., in the driving electronics layer 208) in an e-paper display, and the driving TFT (e.g., in the driving electronics layer 208) in an active matrix OLED (AMOLED) display.

Organic layers in any of the plurality of layers of the flexible electronics assembly 200 may be formed on top of the other of the layers illustrated in FIG. 2 by solution-phase deposition techniques such as spin-coating, slot coating, die coating, printing (e.g., inkjet printing, screen printing, pad printing, offset printing, gravure printing, flexographic printing, lithographic printing, mass-printing and the like), spray coating, electrospray coating, drop casting, dip coating, and blade coating. Inorganic (e.g., metallic or metal oxide) layers usually are deposited by physical or chemical vapor deposition methods (e.g., sputtering), but may be solution-processed if a soluble precursor is available. The layers may be patterned into specific elements by photolithography, either by use of the intrinsic photosensitivity of the layers (e.g., certain polymeric layers) or by use of a photoresist (e.g., metallic, metal oxide, or small-molecule organic layers).

When e-paper techniques are used to construct the flexible electronics assembly 200, the integral display may depict a static image for an indefinite period of time. In particular, because of the bistable nature of an e-paper display, it does not need power to retain an image and, instead, power is only needed to set up or change an image on this type of display. Thus, using e-paper technology for an integral display includes the advantage of being able to display and retain an image on the display for any length of time without depleting a battery of a mobile device.

Although FIG. 2 illustrates particular numbers and types of layers within the layer stack of the flexible electronics assembly 200 by way of example, some implementations of flexible electronics assemblies may include other numbers of layers and/or other types of layers. For example, one or both of the substrates 202a may include multiple substrate layers adhered together (e.g., with a layer of glue). In other examples, a flexible electronics assembly may include one or more touchscreen layers adhered to one or both of the substrates 202a. Generally, flexible electronics displays may include any number or combination of substrate, brittle, electro-optical, driving electronics, touchscreen, transparent conductor, transparent environment barrier or other suitable layers adhered together according to the mounting techniques discussed herein.

Optimal Mounting of the Flexible Display Component

Figure 3A:
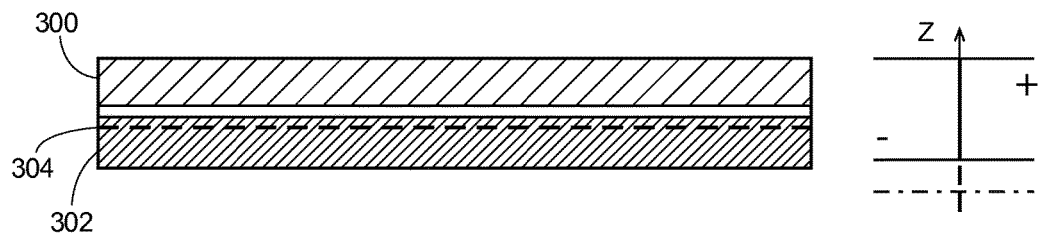
FIGS. 3A and 3B illustrate an existing method for mounting a flexible display component to a support structure component.
Figure 3B:
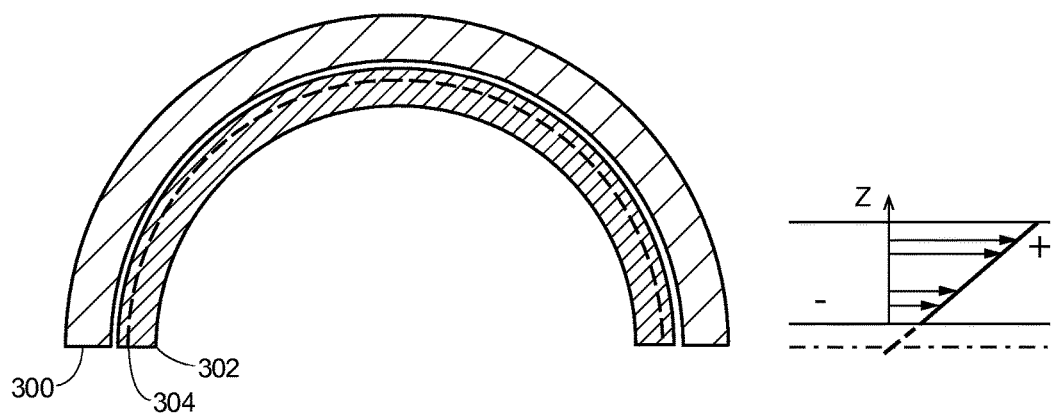

For further clarity and comparison, an existing mounting technique, for mounting a flexible display component 300 on a support structure component 302, is illustrated in FIGS. 3A and 3B. In the existing technique, the flexible display component 300 is mounted to the support structure component 302 while both the flexible display component 300 and the support structure component 302 are in a "flat state." That is, the flexible display component 300 and support structure component 302 are in an approximately unbent or strain-free state (assuming negligible built-in strain in the flexible display component 300 due to processing) when adhered together, as illustrated in FIG. 3A.

As a result of the existing mounting technique, a neutral line or plane of zero strain during bending of the assembly of the components 300 and 302 may be shifted and the flexible display component 300 has limited flexibility. When bent or flexed, as illustrated in FIG. 3B, the flexible display component 300 is subject to relatively high tension across the entire cross section of the flexible display component 300. Such high tensions are likely to result in cracking, or other damage to layers of the flexible display component 300.

To minimize or near-optimally control tension and compression of a flexible display component, current optimal mounting techniques include mounting a bent (e.g., pre-flexed or pre-bent) flexible display component to a bent support structure component. In this manner, the compressive and tensile strains in the layers of the flexible display component (when adhered to a support structure component) that are constraining bending of the flexible display component may remain acceptable (e.g., compliant with flexibility constraints of the flexible display component) in the most extreme bending states of the flexible display component, such as a flat state and a maximally flexed state of a product application. Resulting maximum tension and compression within the flexible display component are minimized or controlled to both (i) prevent buckling, cracking, delaminating, etc. of the layers of the flexible display component and (ii) satisfy flexibility requirements of a product application, such as a bracelet-type device application.

FIGS. 4A, 4B, 4C, and 4D illustrate an example implementation of an optimal mounting of a flexible display component 400 to a support structure component 402 so as to form a flexible electronics assembly 404. The flexible electronics assembly 404 may include any suitable combination of the materials, components, and connections discussed with reference to FIGS. 1 and 2. However, for ease of discussion, FIGS. 4A, 4B, 4C, and 4D do not illustrate components such as interlayers, electronics modules, etc.

Figure 4A:
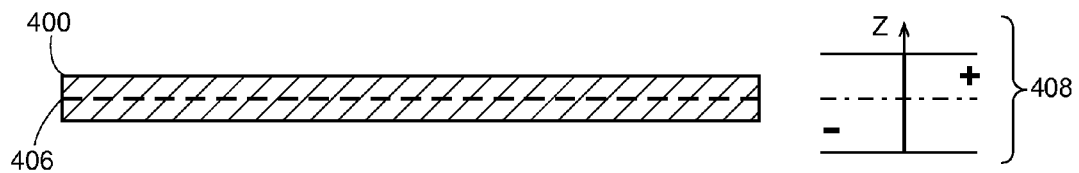
FIGS. 4A, 4B, 4C, and 4D illustrate an example optimal mounting of a flexible display component to a support structure component to form a flexible electronics assembly, such as a flexible display assembly to be integrated into the article illustrated in FIG. 1A.

FIG. 4A illustrates a cross section of the flexible display component 400 in a flat state before being bent, flexed, or adhered to the support structure component 402. The flexible display component 400 includes a neutral line of zero strain 406 (e.g., tension or compression) within the flexible display component 400 at a location illustrated in FIG. 4A by a dotted line. In the flat state, the flexible display component does not experience any (or a negligible amount of) positive (i.e., tension) or negative (i.e., compression) strain above (towards the positive "z" coordinate) or below (towards the negative "z" coordinate) the neutral line 406, as illustrated in the strain diagram 408. In some cases, a flexible display component will experience positive or negative strain in a flat state due to manufacturing or process variability. However, on average, a flat state of the flexible display component 400 may exhibit a strain profile similar to that illustrated in the strain diagram 408.

Figure 4B:
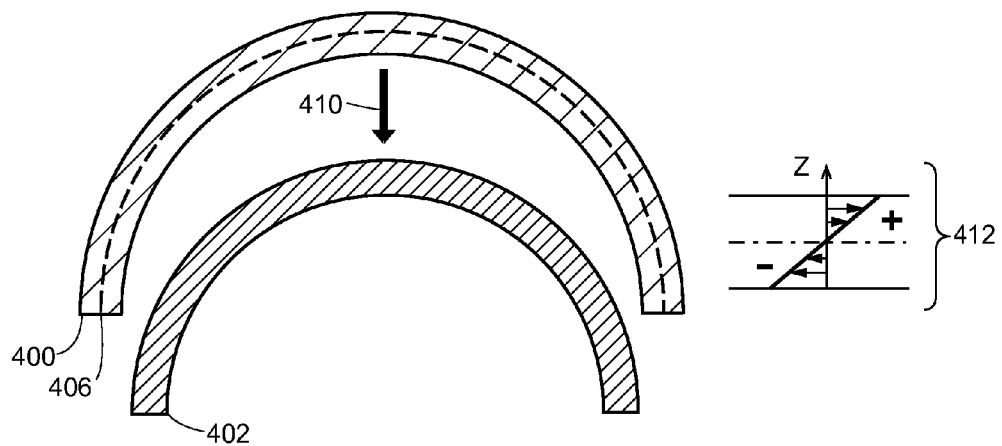

FIG. 4B, illustrates an example bent, or flexed, state of the flexible display component 400 and an example bent state of the support structure component 402. In the bent state, an edge of the flexible display component 400 is aligned with a curved contour. The curved contour, by way of example and without limitation, may be a circle defined by a certain radius, an oval defined by a symmetry axis and one or more radii, an ellipse defined by a positive constant and two fixed points, a non-symmetric curved contour, a piecewise combination of straight and curved line segments, or any other suitable non-flat or non-straight contour. In some cases, the curved contour may be defined with a relation to flexibility requirements of a product application, such as requirements of flexing at or beyond certain points, radii, angles, or locations.

The example bent state of the support structure component 402 may be formed by flexing or bending the support structure component 402 to a similar or related curved contour as that of the bent state of the flexible display component 400. For example, the curved contour along which the support structure component 402 is bent or flexed, in the bent state, may include a contour that is concentric with or shares dimensions/locations (e.g., radii, fixed points, etc.) with the curved contour along with the flexible display component 400 is bent or flexed. In this manner, the bent flexible display component 400 may be adhered to the bent support structure component 402 without any space between the flexible display component 400 and the support structure component 402, as illustrated by the arrow 410.

Although not shown in FIG. 4B, a machine, operator, or other manufacturing or process component may hold or constrain the flexible display component 400 and the support structure component 402 in respective bent states until or while the bent flexible display component 400 is being adhered to the bent support structure component 402. For example, a machine or operator may place the flexible display component 400 and/or the support structure component 402 in a form, mold, clamping system, etc. to hold the flexible display component 400 in a bent state until the flexible display component 400 is adhered to the support structure component 402.

In the bent state, the flexible display component 400 maintains a certain strain profile, because the flexible display component 400 is flexed to the bent state in isolation, or apart from the support structure component 402. As illustrated in a strain diagram 412, the flexible display component 400 experiences a relatively equal amount of strain above and below (i.e., towards positive and negative "z," respectively) the neutral line 406. As illustrated in this strain profile, the flexible display component 400 experiences smaller (in magnitude) strains in the bent state as compared with the flexible display component 300 adhered to the support structure component 302 in a flat state.

Although FIG. 4B illustrates a bending or flexing of the flexible display component 400 and the support structure component 402 in isolation (i.e., apart from one another), the flexible display component 400 and the support structure component 402 may be flexible to a bent state while in contact with one another, in an implementation. In such an implementation, a machine or operator may place both the flexible display component 400 and the support structure component 402 in the same form or mold without applying a glue or other agent to adhere the flexible display component 400 and the support structure component 402 together. Alternatively, a machine or operator may place both the flexible display component 400 and the support structure component 402 in the same form or mold with a glue or other agent to adhere the flexible display component 400 to the support structure component 402, where the fixing agent (e.g., glue) is selected so as to allow slipping between the flexible display component 400 and the support structure component 402 during flexing to the bent state. That is the fixing agent that adheres the flexible display component 400 to the support structure component 402 may allow slipping between the flexible display component 400 and the support structure component 402 while flexing to the bent state, while, after some time (e.g., time for a glue to dry or become hard) and/or through the application of UV light or changes in temperature, the fixing agent fixedly adheres the flexible display component 400 to the support structure component 402 without slippage.

Figure 4C:
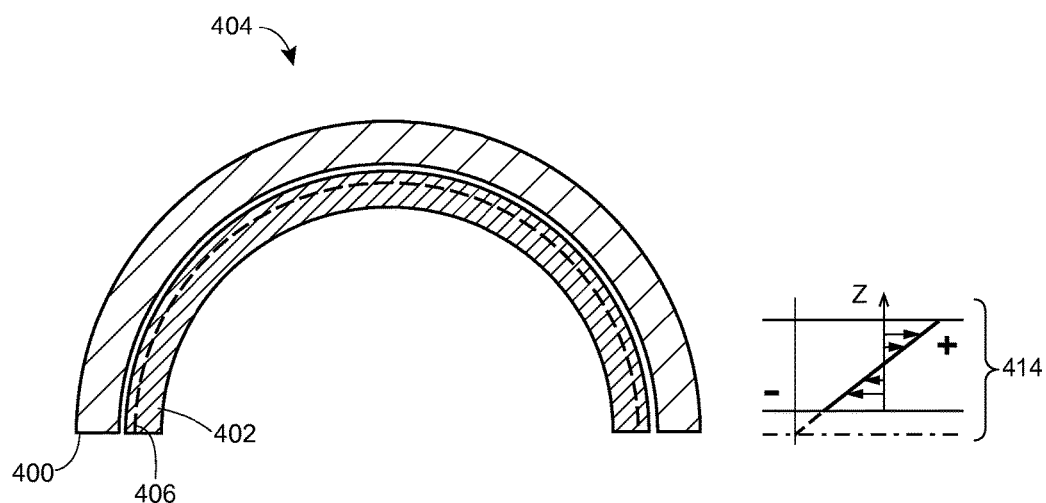
Figure 4D:
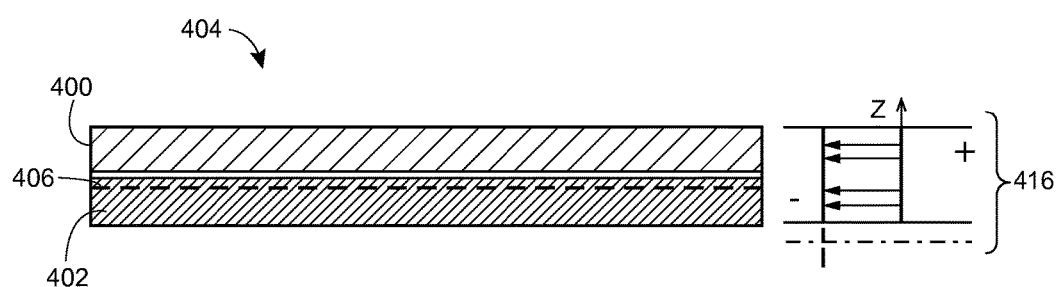

FIG. 4C illustrates the example flexible electronics assembly 404 flexed to the curved contour with the flexible display component 400 adhered to the support structure component 402. As described above, an adhesive layer (e.g., interlayer 106) or other fixing agent adheres the flexible display component 400 to the support structure component 402 while both the flexible display component 400 and the support structure component 402 are flexed or bent to the curved contour. As such, when the flexible electronics assembly 404 is flexed to the curved contour, the magnitudes of strain experienced by critical layers in the flexible display component 400 are below magnitudes of strain that would cause damage to the critical layers (e.g., the magnitudes of strain are "acceptable" or "compliant") in both the bent state (FIG. 4C) and the flat state (FIG. 4D). In the example case illustrated in FIGS. 4C and 4D, the maximum tension/compression in a strain diagram 414 (bent state) is roughly the same as the maximum compression in a strain diagram 416 (flat state), and both maximum values of strains (compression and tension) are tolerable for the flexible display component 400 without damage to any critical layer. Thus, the flexible electronics assembly 404 may flex in the range from the flat state to the bent state (i.e., according to flexibility requirements of the products) without any buckling, cracking, or other damage to layers of the flexible display component 400.

Once adhered, the flexible electronics assembly 404 may bend or flex within a certain range of angles or radii without a buckling, cracking, delaminating, etc. of the flexible display component 400. Because the flexible display component 400 and the support structure component 402 are adhered in a bent state, the flexible electronics assembly 404 may naturally (i.e., without user or operator interaction) tend to be oriented along a curved contour, such as a curved contour with a bending radius between that of the flexed state illustrated in FIG. 4C and the flat state illustrated in FIG. 4D. When flexed back to a flat state, the flexible display component 400 of the flexible electronics assembly 404 may experience a maximum strain (e.g., compression), as illustrated in a strain diagram 416. Moreover, when flexed to a radius greater than (with respect to the flat state) the curved contour illustrated in FIG. 4C, the flexible display component 400 may experience a maximum strain (e.g., tension) roughly equal in magnitude to the maximum strain experienced in the flat state.

In this manner, the optimal mounting illustrated in FIGS. 4A, 4B, 4C, and 4D may allow a flexible electronics assembly to flex, without damage (e.g., buckling or cracking), according to flexing requirements of a product application, such as a bracelet-type device. For example, such an optimal mounting may allow flexing of the flexible electronics assembly from 0° to 90° with respect to a flat state, whereas a flexible electronics assembly utilizing existing mounting techniques (e.g., assembling a flexible electronics assembly in a flat state) may only be capable of flexing from +45° to −45° with respect to a flat state.

In some cases, flexibility constraints of a flexible electronics component, such as a flexible display component, may be primarily dictated by properties of one or more "critical" layers of a stack of the flexible electronics component. For example, brittle outer layers of a flexible display component may dictate the flexibility constraints of the flexible display component, and, in such an example, the critical layers (outer brittle layers) both dictate the flexibility constraints and experience the highest values of compression or tension. However, it is clear that critical layers of a flexible electronics component may not be disposed on the outside, or towards the outer edges, of the flexible electronics components. In general, an optimal mounting may utilize any suitable curved contours, along which flexible electronics and support structure components are bent, such that a resulting flexible electronics assembly may minimize or near optimally control strain values at any location within the flexible electronics component.

Although FIGS. 4A, 4B, 4C, and 4D depict a particular optimal mounting of a flexible display component to a support structure component that maintains a certain pre-defined strain distribution or profile, optimal mountings may be configured such that any suitable pre-defined strain distribution is selectively maintained. That is, in some implementations, an optimal mounting may intentionally maintain a certain strain profile such that a flexible electronics assembly meets particular product requirements other than a flexibility between 0° to 90° with respect to a flat state. For example, a flexible display component and a support structure component may be bent to a particular curved contour and adhered while bent to the particular curved contour such that the resulting flexible electronics assembly is capable of flexing without breaking in the range +90° to 0°, +25° to −65°, +10° to −80°, +10° to −30°, etc. with respect to the flat state.

Further, although the flexible display component 400 is illustrated as being disposed on an outer diameter or radius of flexing as compared to the support structure 402, it is understood that a flexible electronics assembly may be configured such that the flexible display component is on an outer or inner diameter of flexing. In particular, a display device that may be "rolled up" into an enclosure, such as a roll-out e-reader display that may be rolled in and out of an enclosure, may integrate a flexible electronics assembly in which a flexible display component is disposed on an inner radius or diameter of bending.

Optimal Mountings with Spatially Separated Curvatures

It is clear that, although FIGS. 4A, 4B, 4C, and 4D illustrate a mounting of the flexible display component 400 to the support structure component 402 while both components 400 and 402 are bent to one near-circular contour, a flexible display component does not have to be mounted using one uniform bending radius. In fact, flexible display assemblies may include portions, or zones, configured for certain flexibility requirements different than flexibility requirements for other portions, or zones, of the flexible display assemblies. FIGS. 5A, 5B, and 5C and FIGS. 6A, 6B, and 6C illustrate two example flexible display assemblies in which respective flexible display components are mounted using more than one spatially separated radius of curvature to produce various portions, or zones, of the flexible display components with different flexibility characteristics as compared to other portions of the flexible display components.

Figure 5A:
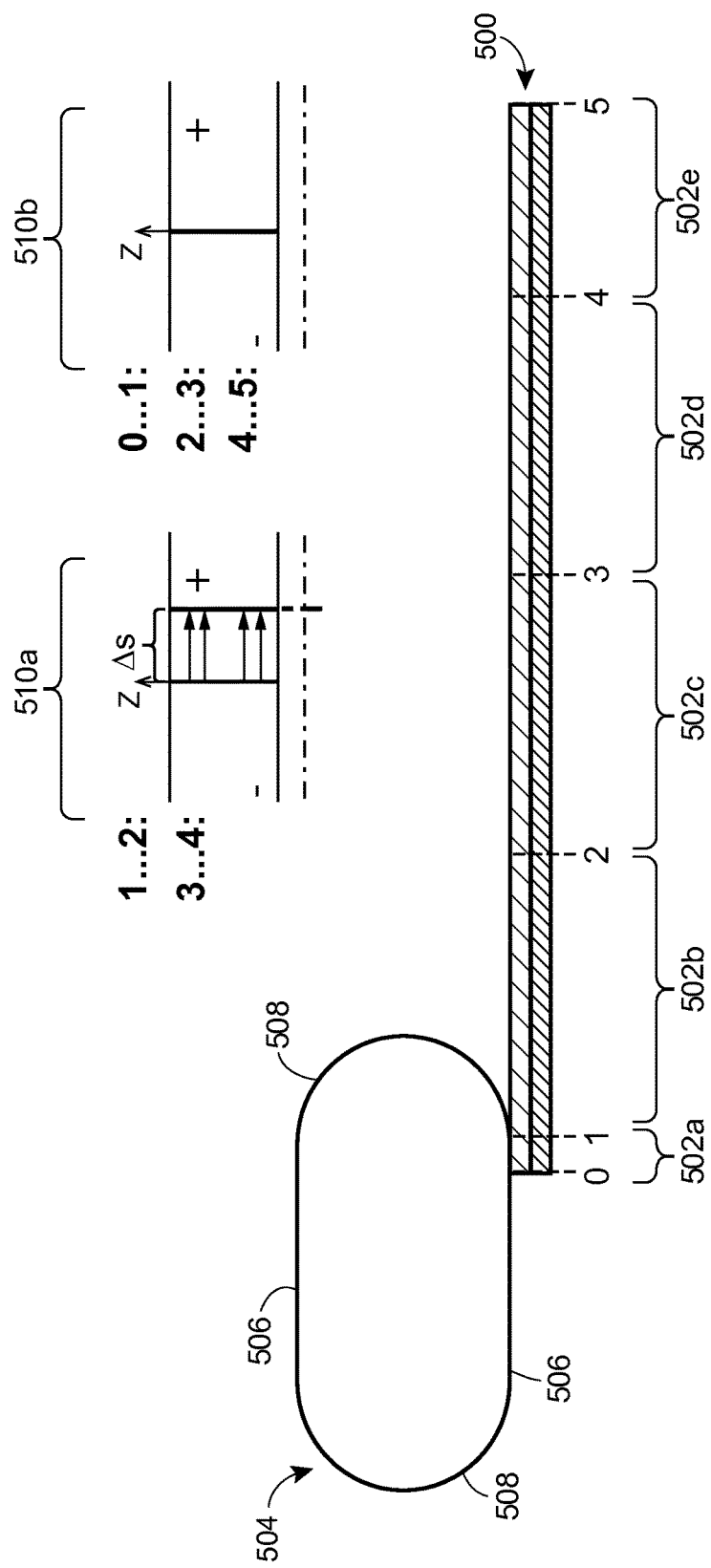
FIGS. 5A, 5B, and 5C illustrate an example product application of a flexible electronics assembly, such as a flexible electronics assembly formed using the optimal mounting techniques of FIGS. 4A, 4B, 4C, and 4D.
Figure 5B:
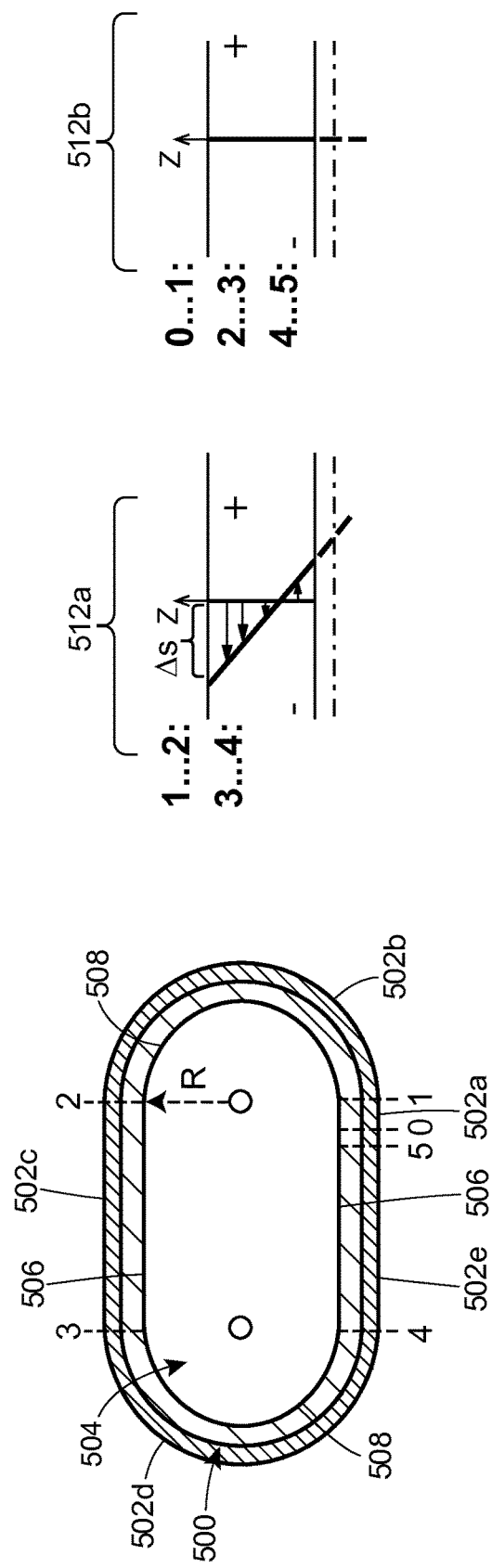
Figure 5C:
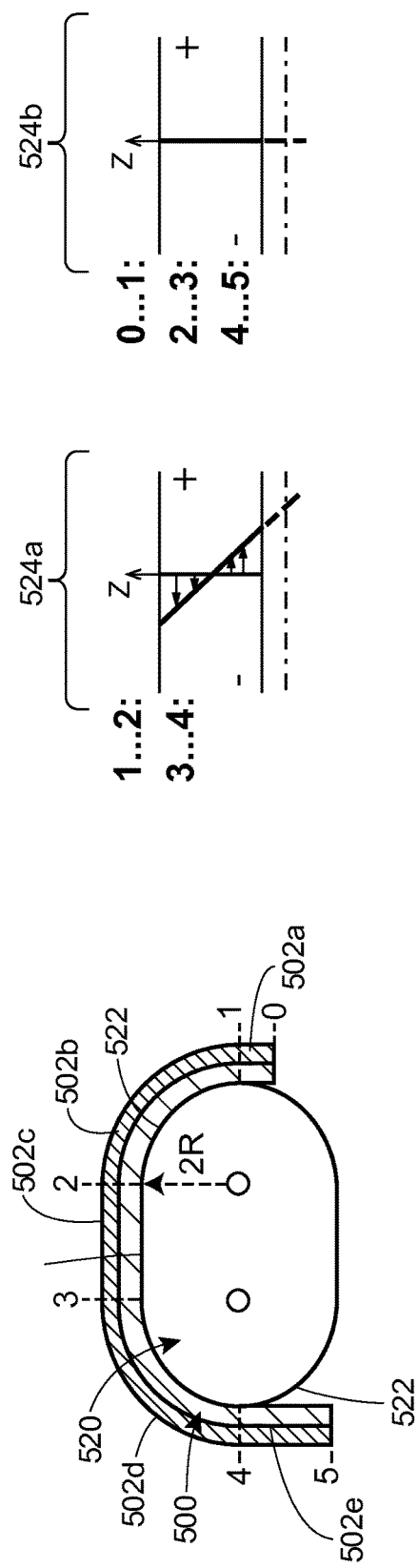

In particular, FIGS. 5A, 5B, and 5C depict an example application of a flexible electronics assembly 500, such as in a roll-out e-reader device, where the flexible electronics assembly is configured such that a magnitude of tension in a flat state is near equal to a magnitude of the compression in one or more "bending zones" in a flexed or bent state. The flexible electronics assembly 500 may include any suitable combination of the materials, components, and connections discussed with reference to FIGS. 1 and 2. However, for ease of discussion, FIGS. 5A, 5B, and 5C do not illustrate components such as interlayers, electronics modules, etc.

As illustrated in FIG. 5A, the example flexible electronics assembly 500 (depicted as a cross section) includes one or more zones $502a$, $502b$, $502c$, $502d$, and $502e$ (e.g., separated by dotted lines labeled 0-5), where each of the one or more zones $502a$, $502b$, $502c$, $502d$, and $502e$ may be formed using an optimal flexible display mounting technique different than in other of the zones $502a$, $502b$, $502c$, $502d$, and $502e$. The flexible electronics assembly 500 is configured to wrap, flex, or bend along a contour 504 including one or more flat segments 506 and one or more curved segments 508 in the product application. For example, the flexible electronics assembly 500 may be configured to wrap around the contour 504 such that the flexible electronics assembly 500 may be used as a display that may be rolled onto or unrolled from a drum or enclosure having the shape of the contour 504.

Each of the zones $502a$, $502b$, $502c$, $502d$, and $502e$ may correspond to a particular one of the flat segments 506 and the curved segments 508. When wrapped around the contour 504, each of the zones $502a$, $502b$, $502c$, $502d$, and $502e$ may experience different types and amounts of strain. As such, an optimal mounting may produce the flexible electronics assembly 500 such that each of the zones $502a$, $502b$, $502c$, $502d$, and $502e$ is not damaged when flexed to the contour 504, as illustrated in FIG. 5B.

In particular, the zones $502b$ and $502d$ flex or bend when the flexible electronics assembly 500 is wrapped around the contour 504, whereas the zones $502a$, $502c$, and $502e$ remain in a flat state when wrapped around the contour 504. To compensate for these differences in flexing, an optimal mounting to form the flexible electronics assembly 500 may include: (i) mounting a flexible display component in a bent state to a support structure component in a bent state in the zones $502b$ and $502d$; and (ii) mounting a flexible display component in a flat state to a support structure component in a flat state in the zones $502a$, $502c$, and $502e$. Such an optimal mounting may result in the strain profiles or distributions illustrated in flat state strain diagrams 510 and flexed state strain diagrams 512, respectively.

The zones $502b$ and $502d$ (the zones that flex or bend along the curved segments 508) may experience tension in a flat state (see strain diagram $510a$) and tension/compression in a bent state (see strain diagram 512a), where magnitudes of maximum strain in the flat state and bent state are compliant with flexibility constraints of one or more layers within the flexible display component. The other zones 502a, 502c, and 502e may experience negligible strain due to flexing in both the flat state and the bent state, as illustrated in the strain diagram 510b in FIG. 5A and the strain diagram 512b in FIG. 5B.

FIG. 5C illustrates another example curved contour 520 that may be used in adhering a flexible display component of the flexible electronics assembly 500 to a support structure component of the flexible electronics assembly 500. That is, a flexible display component and a support structure component may be wrapped or bent around the curved contour 520 and then adhered together in respective bent states so as to create at least acceptable and when optimized roughly equal in magnitude, or symmetric (compression and tension), maximum strains for both the flat and the bent states in critical layers of the flexible display component.

To create such a symmetric strain profile, the curved contour 520, used in adhering of the flexible electronics assembly 500, may include one or more curved segments 522 having a radius of curvature twice as large as the radius of curvature of the curved segments 508 (depicted in FIGS. 5A and 5B). After the support structure has been adhered to the flexible display component, the flexible electronics assembly 500 may experience a strain distribution as depicted in the strain diagrams 524a and 524b. Although, the example curved contour 520 includes radii twice as large as radii of the curved segments 508, it is clear that a curved contour used in adhering a flexible electronics assembly to a support structure assembly may include radii or dimensions scaled in any suitable manner so as to selectively produce an symmetric, or other advantageous, distribution of strain in an application of the flexible electronics assembly.

Figure 6A:
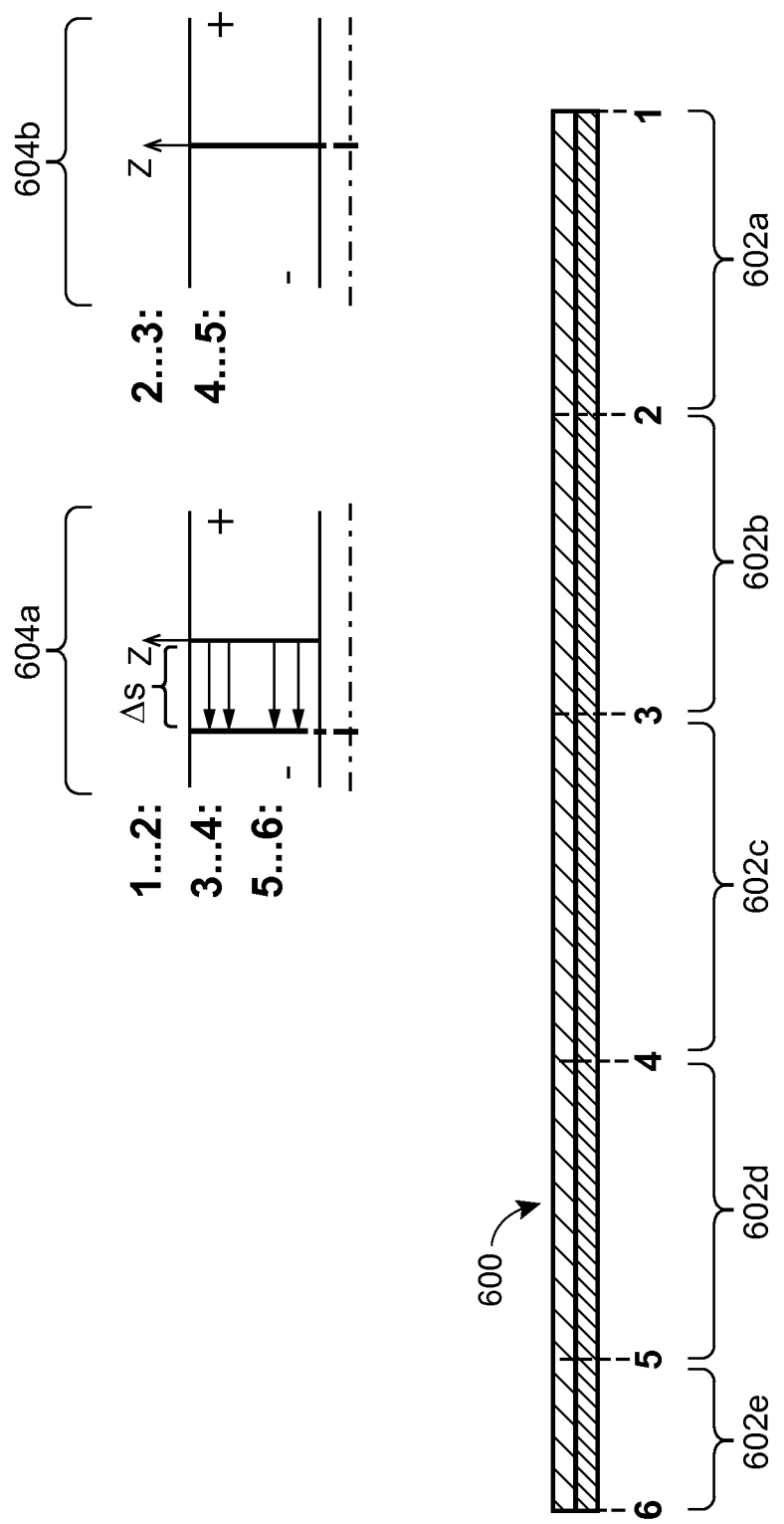
FIGS. 6A, 6B, and 6C illustrate another example product application of a flexible electronics assembly, such as a flexible electronics assembly formed using the optimal mounting techniques of FIGS. 4A, 4B, 4C, and 4D.
Figure 6B:
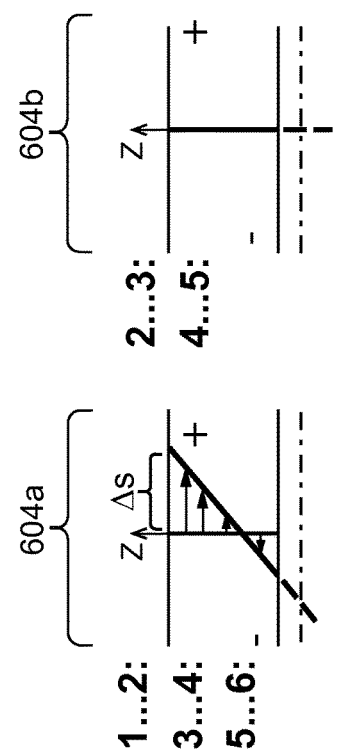
Figure 6B:
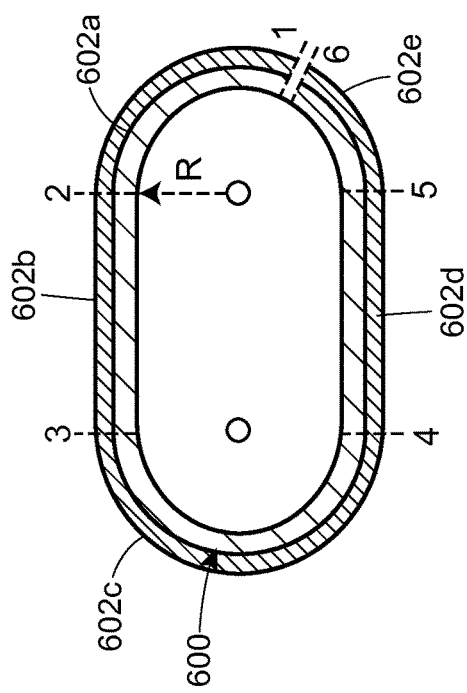
Figure 6C:
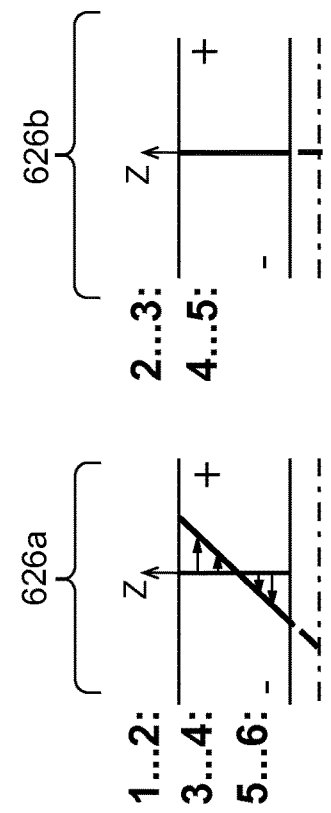
Figure 6C:
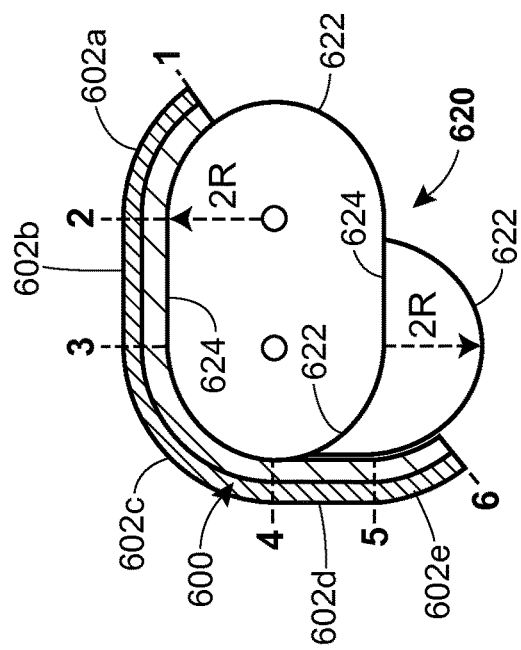

FIGS. 6A, 6B, and 6C depict an example application of a flexible electronics assembly 600, such as in a wearable bracelet-type device. As with the flexible electronics assembly 500, the flexible electronics assembly 600 may include one or more zones 602a, 602b, 602c, 602d, and 602e where each of the zone 602a, 602b, 602c, 602d, and 602e may experience different strains and/or may have different flexing requirements (in the product application) as compared to other of the zones 602a, 602b, 602c, 602d, and 602e. As such, each of the zones 602a, 602b, 602c, 602d, and 602e of the flexible electronics assembly 600 may include an optimal mounting of a flexible display component to a support structure component different than optimal mounting of other of the zones 602a, 602b, 602c, 602d, and 602e.

FIG. 6A illustrates the flexible electronics assembly 600 in a flat state, where the strain distribution in the various zones 602a, 602b, 602c, 602d, and 602e is represented in the strain diagrams 604a and 604b. FIG. 6B illustrates the flexible electronics assembly 600 in a bent or curved state of the flexible electronics assembly 600, such as a curved state of a wristband application when the wristband is wrapped around a user wrist. In the curved state, illustrated in FIG. 6B, the zones 602a, 602b, 602c, 602d, and 602e experience strain distributions (across zone cross sections) as represented by the strain diagrams 606a and 606b.

As depicted in FIG. 6B, the zones 602a, 602c, and 602e are flexed or bent in the curved state while zones 602b and 602d remain flat. The zones 602a, 602c, and 602e will experience both compression and tension (see strain diagram 604a), where the neutral line may be located within a support structure component of the flexible electronics assembly 600. In order to meet the product flexibility requirements, as illustrated in FIG. 6B, without buckling or cracking, the zones 602a, 602c, and 602e of the flexible electronics assembly may be optimally mounted by adhering a flexible display component and a support structure component in a bent state.

To create a pre-defined or optimal strain profile or distribution for the flat and the compact states, a machine or operator may utilize a curved contour 620 in adhering a flexible display component of the flexible electronics assembly 600 to a support structure component of the flexible electronics assembly 600. The curved contour 620, may include one or more curved segments 622 having a radius of curvature twice as large as the radius of curvature of segments of the curved state depicted in FIG. 6B (i.e., "2R") such that the flexible electronics assembly 600 is assembled or formed at a radius of curvature between a flat state and a bent state. For optimal mounting, a machine or operator may bend a flexible display component and a support structure component along the curved segments 622 and one or more flat segments 624 of the curved contour 620 and, subsequently, adhere the bent flexible display component and bent support structure component together to form the flexible electronics assembly 600. After the support structure has been adhered to the flexible display component along the curved contour 620, the flexible electronics assembly 600 may experience a strain distribution as depicted in the strain diagrams 626a and 626b.

In some cases, a flexible electronics assembly may have a built-in asymmetrical bending profile, meaning that a bending with a display surface inwards has a different minimum bending radius than a bending with the display surface facing outwards. Such an asymmetrical bending profile may be due to asymmetry in the stack layering (e.g. a thicker top substrate than bottom substrate) or due to build-in stress in the display (e.g. thermal stress due to a brittle layer that was deposited at a high temperature), for example. An optimal mounting may also take into account this asymmetry when determining one or more curved contours for the mounting process. As such, an optimal mounting may even be beneficial for certain product applications requiring a bending range centered around a flat state (e.g., ±30°) and substantially equal maximum compressive and tensile strains in one or more layers of a flexible display/electronics component.

Although some optimal mounting may utilize bent flexible display components and bent support structure components at a bending radius of twice the radius of product flexibility requirements (as illustrated in FIGS. 5C and 6C), an optimal mounting for attaching a support structure component to a flexible display component may include any suitable curved contours different from twice the radius of product flexibility requirements (i.e. different from "2R"). For example, an optimal mounting may utilize curved contours with radii greater than 2R to create compliant or when fully optimized symmetric tension/compression values in critical layers of a flexible display component when the flexible display component is bent to the two most extreme bending states, even when a flexible electronics assembly has a built-in asymmetry.

In addition, a flexible electronics assembly may be subject to certain "relaxation" effects. These relaxation effects may be due to a creep or slippage between layers and/or a visco-elastic response of layers, such as layers of a display stack. As such, some of a built-in strain profile (symmetric or asymmetric) of a flexible electronics assembly may be lost or shifted during use of the flexible electronics assembly. In some implementations, an optimal mounting may utilize curved contours with radii less than 2R to create compliant or when fully optimized symmetric tension/compression values in critical layers of a flexible display component when the flexible display component is bent to the two most extreme bending states, even when a flexible electronics assembly is subject to such relaxation effects.

Further, although closed curved contours, such as the contours 520 and 620, are illustrated in FIGS. 5C and 6C, a curved contour utilized in an optimal mounting need not be closed. That is a curved contour may include open line segments, arcs, or non-symmetric curved line segments rather than or in addition to circles, ellipses, piecewise curved shapes, and other closed contours.

Method for Optimal Mounting

Figure 7:
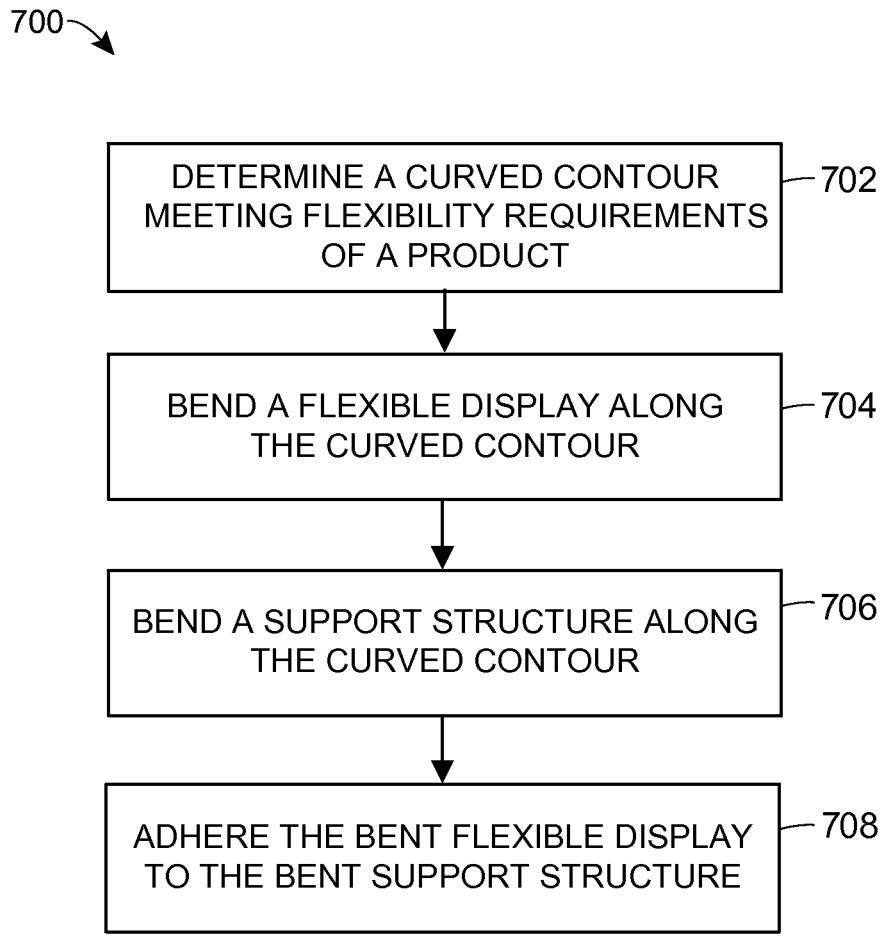
FIG. 7 is a flow diagram of an example method for mounting a flexible electronics component to a support structure component, which may be applied to the flexible display component and the support structure component illustrated in FIG. 1B.

FIG. 7 is a flow diagram of an example method 700 for mounting a flexible display component on a support structure component to form a flexible electronics assembly. The method may be applied to mount any one of the flexible display components 104 or 200 to the support structure component 108, for example.

As illustrated at a block 702 of FIG. 7, a curved contour may be determined for the optimal mounting such that flexibilities requirements of a product are met. The curved contour may include one or more curved segments and one or more flat segments. For example, the curved contour may include segments specific to certain zones of a flexible electronics assembly, as discussed further with reference to FIG. 5C and FIG. 6C.

A machine, computing device, or operator of a manufacturing process or plant may determine the curved contour based on the product flexibility requirements. In one implementation, minimum bending radii, ranges of bending measured in radii of curvature from a flat state, or locations and dimensions of a product may be input to a computing device, such as a laptop, desktop, or tablet computer, to automatically calculate the curved contour. The computing device may, for example, store computer-executable instructions in one or more non-transitory memories (e.g., RAM or ROM) that, when executed by one or more processors of the computing device, calculate the curved contour to be calculated based on the product flexibilities requirements and one or more models of stain (e.g., mathematical formulas of strain).

A flexible display component, or flexible display, is bent along the curved contour at block 704. For example, based on the determined curved contour, a flexible display component, such as the flexible display component 104, may be bent or flexed such that the flexible display component is aligned with the closed contour. As discussed further with reference to FIGS. 4B and 4C, a machine (e.g., a process control machine) or operator may utilize any suitable combination of molds, clamps, rollers, rolls, forms, etc. to bend to the flexible display component along the curved contour. Likewise, a support structure component is bent or flexed along the curved contour at block 706.

Once bent, the bent flexible display component is adhered to the bent support structure component at block 708. A machine or operator may utilize one or more clamps, forms, etc. to press the bent flexible display component to the bent support structure component. In some cases, block 708 may position various interlayers and/or adhesive layers between the bent flexible display component to the bent support structure component when the components are attached or mounted.

The flexible electronics assembly resulting from the adhering of the bent flexible display component to the bent support structure component may satisfy the product flexibility requirements without damage, such as buckling, cracking, delaminating, etc. Generally, the method 700 may be utilized to produce a flexible electronics assembly in which a bending or flexing range is shifted with respect to a bending or flexing range of an assembly in which similar components are mounted in a flat state.

Although bending or flexing of a flexible electronics assembly in one dimension (with respect to a flat state) or even two dimensions (along a piece curved contour) is emphasized above, it is understood that an optimal mounting, such as in the example method 700, may selectively bend and adhere components of a flexible electronics assembly according to product flexibility requirements in three dimensions. For example, an optimal mounting may include: (i) bending a flexible display component and a support structure component in three dimensions (along a circle and perpendicular to the circle, such as along a width of the components); and (ii) adhering the bent flexible display component and the bent support structure component.

Electronics Module

Figure 8:
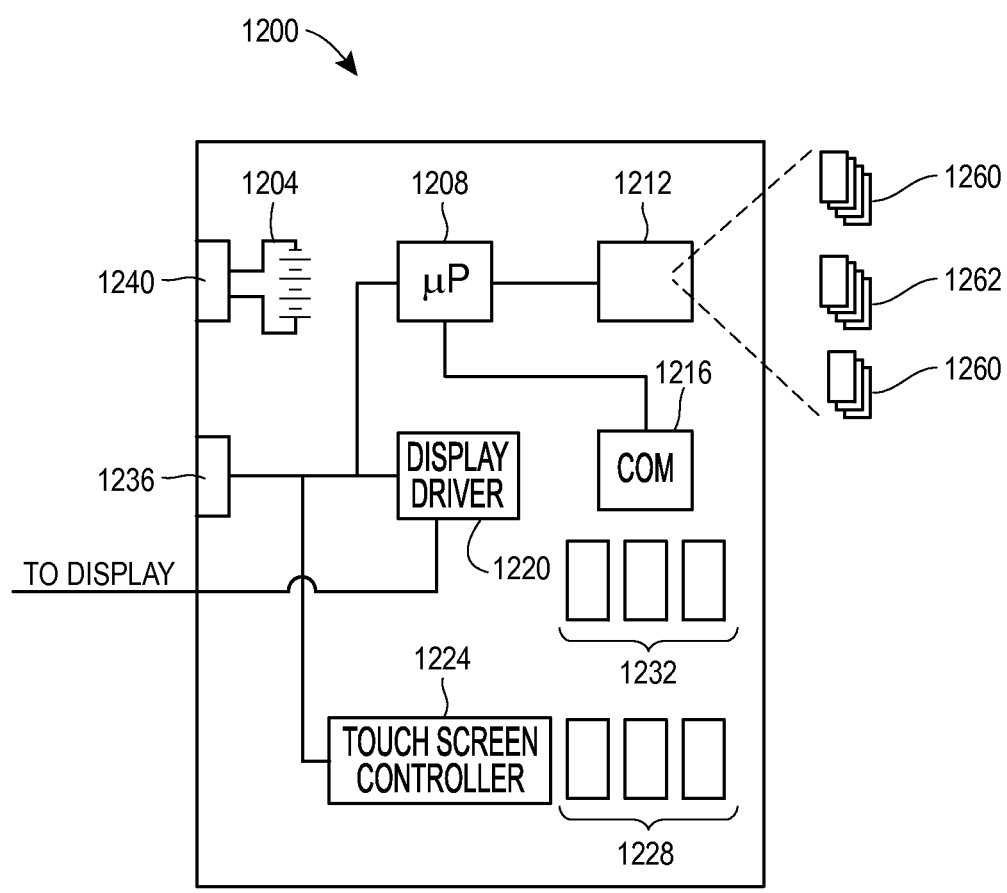
FIG. 8 is a block diagram of an electronics module that can be utilized in connection with any of the articles or product applications described herein.

FIG. 8 illustrates a block diagram of various electronic components, referred to herein as an electronics suite 1200, that may be used in or disposed in an electronics module (e.g., the electronics module 124) to drive a flexible display component (e.g., the flexible display 104) of an article (e.g., the article 100). In particular, the electronics suite 1200 illustrated in FIG. 8 includes a battery 1204 that powers a number of other modules or electronic components including a microprocessor or other processor 1208, a computer readable memory 1212, which may be, for example, a flash memory or other suitable type of non-transitory, tangible, data storage medium, a communication module 1216, a display driver 1220, a touch screen controller 1224 and a number of sensors 1228 and other secondary devices 1232. The sensors 1228 may include, for example, an impact sensor or step counter, one or more gyroscopic sensors or gyroscopes, temperature sensors, vibration sensors, pulse rate monitors, pressure sensors, strain gauges, etc. The secondary electronic devices 1232 may include, for example, an alarm or noise creation device, a speaker, a microphone, or a vibrator the operation of which causes the electronics module 19 to vibrate, etc. Although FIG. 8 illustrates the sensors 1228 and the secondary electronic devices 1232 as being integral with the electronics suite 1200, in some cases, one or more of the sensors 1228 and/or the secondary electronic devices 1232 are physically disposed at another location on or in the article (e.g., separate from the remainder of the electronics suite 1200). In these cases, though, the separately disposed sensors 1228 and/or secondary electronic devices 1232 remain in communicative connection with the remainder of the electronics suite 1200 (e.g., via a wired or wireless connection).

Similarly, although FIG. 8 illustrates the display driver 1220 as being integral with the electronics suite 1200, in some cases, the display driver 1220 is physically disposed at another location separate from the remainder of the electronics suite 1200. In an example, the display driver 1220 is disposed in a location that is proximate to the electrodes or connectors of the pixel elements of the flexible display component, e.g., on the backplane of the flexible display component or at some other suitable location. The separately located display driver 1220, though, remains in communicative connection with the remainder of the electronics suite 1200 (e.g., via a wired or wireless connection) despite of the remote locations.

As will be understood, the memory 1212, the communication module 1216, the display driver 1220 and the touch screen controller 1224, as well as the sensors 1228 and other secondary electronic devices 1232, are communicatively connected to the processor 1208 and may operate to perform various functions in conjunction with applications or other programs implemented by the processor 1208. Still further, each of these elements is connected to and is powered by the battery 1204 in any known or desired manner. Still further, the electronics suite 1200 of FIG. 8 may include one or more communication ports, such as communication port 1236 (e.g., a USB or other type of digital communication port) and a power or battery charger input port 1240. In this case, the power input port 1240 may be connected to the battery 1204 and enable charging or recharging of the battery 1204 using any known or desired recharging circuitry and methodology. Alternatively or in addition, the communications input port 1236 (in the form of for example, a USB input port) may be connected to the battery 1204 and provide power to the battery 1204 for charging battery 1204, and the input port 1236 may also be connected to the microprocessor 1208, as well as to the communication circuit module 1216, for performing wired-based communications via the input port 1236. Of course, the communication input port 1236, while being illustrated as a USB-type connection, could any other type of known wired or physical communication connection, including any desired serial or parallel digital communication port using any number of pins or wires, as is known in the art, an analog communication port, etc. In another embodiment, the power input port 1240 may be a wireless input port, and in this case may, for example, be part of a battery charger unit that operates to charge the battery 1204 using, for example, an inductively coupled charging technique. If the battery charger unit is part of an inductively coupled charging system, it generally responds to electromagnetic waves produced by an exterior charging unit (not shown) to charge the battery 1204 when the article is disposed near the external charging unit. In another case, the battery charger of the input port 1240 may be a kinetic energy charger unit that converts motion of the article (such as that associated with movement of an arm when the article is in the form of a wristband, as shown in FIGS. 1A-1C) into electrical energy which is provided to charge the battery 1204.

As will be understood, the processor 1208, which may be a programmable, general-purpose processor or a specially programmed processor programmed using any desired type of hardware or firmware programming, generally coordinates and implements the operation of the flexible display component and the associated electronic components as described in more detail herein. The computer readable memory 1212 stores various applications, including for example the general operating system implemented by the processor 1208, and various applications (illustrated as a set of applications 1260 in FIG. 8) to be run on the processor 1208 to implement various different types of functionality via the article, some of which will be described in more detail herein. The memory 1212 may also store one or more data files 1262, which may be, for example, image or video data files associated with various images to be displayed on the flexible display component at various different times. Still further, the memory 1212 may store application data that may be created by the various applications 1260 or the microprocessor 1208 as part of the operation of various applications 1260 and to be used by those applications 1260 either during runtime of the applications 1260 or at other times. If desired, the microprocessor 1208 or one of the secondary electronic components 1228 may include or be a clock that tracks the current time, day, date, month, year, time zone, etc.

As an example, one or more of the applications 1260 may implement various functionalities typically associated with standard computers or other types of electronic devices such as personal handheld electronic devices, including for example an e-mail application, an Internet or web-browsing application, an alarm clock application, a calendar application, a music-playing application such as an MP3 application, a video application, a digital picture slideshow application, a mapping application, an e-reading application which may provide books, notes, magazines or other types of articles, for reading by the user, etc. Still further, one or more of the applications 1260 may operate on the processor 1208 to turn the flexible display component associated with the dynamically flexible article into a slave display device that may be tied to or communicably coupled to an exterior master device that is generating content to be displayed via the flexible display component. The master device, which may be a smart phone or a nearby computer device, may be wirelessly connected to the electronics suite 1200 to provide content to be displayed on the flexible display component and will typically have more memory, and computing and processing power than the processor 1208.

The communication module 1216 of FIG. 8 may include or use any type of communication hardware/software/firmware that uses any desired types of communication techniques to enable the microprocessor 1208 to communicate with exterior devices or sources. Of course, the communication module 1216 could include multiple different types of communication hardware/software/firmware, including any kind of hardwire-based communication module or wireless-based communication module. As examples, the communication module 1216 may be a wired or wireless Internet-based communication module that may provide wired or wireless-based, IP protocol communications between the dynamically flexible, article and other devices or a communication network such as a LAN or a WAN to which other devices are communicatively connected. Likewise, the communication module 1216 may include a near field communications (NFC) module, a radio frequency identification (RFID) communications module for communicating with, sending messages to and/or receiving messages from RFID tags stored in other devices around or close to the article. In this case, the communications module 1216 may decode signals received from RFID tags in response to pings by the RFID communication module 1216 to identify the RFID tags or tag numbers (identifiers) associated with these devices. Likewise, the communication module 1216 may be a near field communication (NFC) module or a Bluetooth communication module, which may perform near field communications or Bluetooth communications in any known or desired manner with nearby NFC or Bluetooth enabled devices, thereby enabling wireless communication between the article and other closely situated or closely located electronic devices. Still further, the communications module 1216 may include a USB or other type of wired communication module for decoding and encoding USB-based communication signals to be sent out and received via the USB communication port 1236.

As illustrated in FIG. 8, the display driver 1220 is coupled to the microprocessor 1208 and to the flexible display component, and drives the flexible display component to present different images to a user and thus implement functionality via the flexible display component. The display driver 1220 may be associated with or use any type of display driver technology associated with the various different types of flexible displays that might be used, including, for example, e-ink or other bi-stable display drivers, organic light emitting diode (OLED) display drivers, etc. Of course, it will be understood that the display driver 1220 is connected to the various pixel elements of the flexible display component to cause the pixel elements to change their visual appearance so as to present content image on the flexible display component. Typically, but not necessarily, each pixel element is communicatively connected to two electrodes or connectors corresponding the (x, y) coordinates of the particular pixel element on the flexible display component. Thus, the display driver 1220 provides image content to a set of electrodes or connectors corresponding to a width of the flexible display component (and, in some cases, physically emanating from a width edge of the flexible display component to the driver 1220), and the same display driver 1220 may provide image content to another set of electrodes or connectors corresponding to a length of the flexible display component (and, in some cases, physically emanating from a length edge of the flexible display component to connect to the driver 1220).

Returning to FIG. 8, the display driver 1220 illuminates or causes the pixel elements to obtain or reach a color, a lighting level, an on-off state, etc., so as to drive the flexible display component to present various images and other functionality as determined by the particular application 1260 being executed on the microprocessor 1208. In some cases, the display driver 1220 may cause various images, such as one or more artistic renditions, patterns, etc. or other types of images stored in the memory 1212 to be displayed as one of the images 1262 on the flexible display component. Such an image may be any type of graphic element in the form of artwork, an indication of an association of the user with a particular university or other organization, such as a logo, a mascot, an icon, etc. In the case of a static display, and particularly when the flexible display component is a bi-stable type of flexible display, such as an e-ink type of display, the flexible display component might display a particular image or background image whenever the article is in a sleep mode, and thus in which the display driver 1220 is not operating to actively drive the flexible display component.

Of course, the touch screen controller 1224 is connected to a touch screen interface 109, such as the one illustrated in FIG. 1B, if such an interface exists, and receives input signals from the touch screen interface 109. The controller 1224 operates to decode these input signals to identify touch events that occur with respect to the touch screen interface 109. The touch screen interface 109 may be a capacitive touch screen interface or any other suitable type of touch screen interface disposed over the flexible display component, and may be transparent in nature to thus enable the pixel elements of the flexible display component to be viewable through the touch screen interface 109. Of course, other types of touch screen interfaces may be used instead or as well. In any event, the touch screen controller 1224 operates to energize and control the touch screen interface 109, as well as to recognize and decode touch screen events to identify, for example, the location of each touch screen event, a type of a touch screen event, such as a tap or a swipe movement, etc. If desired, the touch screen controller 1224 alone or in conjunction with the processor 1208 may operate to determine or recognize gestures that are input via the touch screen interface 109, such gestures being, for example, a slide, a swipe, a multi-finger pinch or any other type of gesture that includes one or more finger movements coordinated with one another. Each such gesture may indicate an action to be taken on or via the article. Of course, the article or device may include other or different types of user input devices configured to detect user-generated gestures, such as interfaces that include buttons switches, roller balls, slide bars, pressure sensors, strain gauges, etc., disposed on, for example, the flexible display component or the flexible support structure. Such user interfaces may enable the user to perform more rudimentary functions, such as scrolling movements, on-off powering movements, mode switching, etc. that are traditionally entered via actuateable buttons or switches.

As previously discussed, the sensors 1228 may include any of various different types of sensors. In an embodiment, the sensors 1228 include one or more gyroscopes which detect movement of or the orientation of the article, rapid shaking of the article, etc. One or more of these types of movements may be considered to be a particular type of input or user input, such as a gesture to reset the article, to change a mode of the article, etc. Likewise, the output of such gyroscopes can be used by the microprocessor 1208 to determine the orientation or direction of the flexible display component to enable the microprocessor 1208, or an application 1260 executed on the microprocessor 1208, to determine the proper orientation of the image to be displayed on the flexible display component. In some instances, such motion detection and position detection devices might be located in the flexible support structure or other electronics modules, to enable the article to more accurately determine whether the article is oriented around a wrist or other circular member or whether it is instead laid out flat or oriented in some other manner. The microprocessor 1208 or an application executed thereon may change functionality, behavior, and/or actions of the article based on the detected orientation of the support structure and/or flexible display component.

In some cases, the sensors 1228 include one or more pressure sensors and/or strain gauges which detect pressure, strain, or similar forces that are considered to be an input to cause the functionality, behavior, and/or actions of the article to change, e.g., reset the article, change a mode of the article, change a presentation displayed on the flexible display component of the article, etc. In one example, two pressure sensors are positioned on or attached to the article (e.g., as part of the flexible support structure) so that when the dynamically flexible article is attached to itself in a generally circular or looped configuration, the pressure sensors are diametrically opposed to each other.

Additional Considerations

The following additional considerations apply to the foregoing discussion. Throughout this specification, plural instances may implement components, operations, or structures described as a single instance. Although individual operations of one or more routines or methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter of the present disclosure.

Additionally, certain embodiments are described herein as including logic or a number of components, modules, or mechanisms or units. Modules and units may constitute either software modules (e.g., code stored on a non-transitory machine-readable medium) or hardware modules. A hardware module is tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

A hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also include programmable logic or circuitry (e.g., as encompassed within a general-purpose processor or other programmable processor) that is temporarily configured by software to perform certain operations. It will be appreciated that the decision to implement a hardware module in dedicated and permanently configured circuitry or in temporarily configured circuitry (e.g., configured by software) may be driven by cost and time considerations.

Accordingly, the hardware terms used herein should be understood to encompass tangible entities, be that entities that are physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware and software modules can provide information to, and receive information from, other hardware and/or software modules. Accordingly, the described hardware modules may be regarded as being communicatively coupled. Where multiple of such hardware or software modules exist contemporaneously, communications may be achieved through signal transmission (e.g., over appropriate circuits, lines and buses) that connect the hardware or software modules. In embodiments in which multiple hardware modules or software are configured or instantiated at different times, communications between such hardware or software modules may be achieved, for example, through the storage and retrieval of information in memory structures to which the multiple hardware or software modules have access. For example, one hardware or software module may perform an operation and store the output of that operation in a memory device to which it is communicatively coupled. A further hardware or software module may then, at a later time, access the memory device to retrieve and process the stored output. Hardware and software modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, include processor-implemented modules.

Similarly, the methods or routines described herein may be at least partially processor-implemented. For example, at least some of the operations of a method may be performed by one or processors or processor-implemented hardware modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "application," an "algorithm" or a "routine" is a self-consistent sequence of operations or similar processing leading to a desired result. In this context, applications, algorithms, routines and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" is employed to describe elements and components of the embodiments herein. This is done merely for convenience and to give a general sense of the description. This description should be read to include one or at least one and the singular also includes the plural unless it is obvious that it is meant otherwise.

Upon reading this disclosure, those of skill in the art will appreciate still additional alternative structural and functional designs for mounting a flexible display as disclosed herein. Thus, while particular embodiments and applications have been illustrated and described herein, it is to be understood that the disclosed embodiments are not limited to the precise construction and components disclosed herein. Various modifications, changes and variations, which will be apparent to those skilled in the art, may be made in the arrangement, operation and details of the methods and structure disclosed herein without departing from the spirit and scope defined in the claims.

The invention claimed is:

1. A method for mounting a flexible electronics component to a support structure, the method comprising:
   bending the flexible electronics component to be aligned with a curved contour, the curved contour determined based on a flexibility requirement of a product in which the flexible electronics component is to be integrated and based on one or more flexibility constraints of the flexible electronics component;
   bending the support structure to be aligned with the curved contour; and
   adhering the bent flexible electronics component to the bent support structure to produce a flexible electronics assembly,
     wherein the flexible electronics assembly maintains a strain distribution compliant with the one or more flexibility constraints of the flexible electronics component when flexed according to the flexibility requirement of the product.

2. The method of claim 1, wherein the curved contour includes a curved segment and a flat segment, and wherein bending the flexible electronics component to be aligned with the curved contour includes:
   bending a first zone of the flexible electronics component to be aligned with the curved segment of the curved contour, and
   bending a second zone of the flexible electronics component different from the first zone of the flexible electronics component to be aligned with the flat segment of the curved contour.

3. The method of claim 1, wherein the flexibility requirement of the product includes a requirement to bend the flexible electronics component without damage to one or more layers of the flexible electronics component within a range of bending radii.

4. The method of claim 3, wherein the range of bending radii is biased to one side of a flat state of the flexible electronics component.

5. The method of claim 1, wherein the strain distribution compliant with the one or more flexibility constraints of the flexible electronics component includes a maximum compression in a flat state that is equal in magnitude to a maximum tension in a bent state.

6. The method of claim 1, wherein the strain distribution compliant with the one or more flexibility constraints of the flexible electronics component includes a maximum tension in a flat state that is equal in magnitude to a maximum compression in a bent state.

7. The method of claim 1, wherein flexing according to the flexibility requirement of the product includes flexing to a radius of curvature that is smaller than a minimum bending radius for a non-compliant flexible electronics display, the non-compliant flexible electronics display formed by adhering the flexible electronics component in a flat state to the support structure in the flat state.

8. The method of claim 1, wherein the flexible electronics component of the flexible electronics assembly has a constant non-zero distribution of strain across a cross section of the flexible electronics assembly when the flexible electronics assembly is flexed to a flat state.

9. The method of claim 1, wherein the flexible electronics component is a flexible display.

10. The method of claim 9, further comprising:
    attaching, via one or more electrical connections, an electronics module to the flexible electronics assembly to display images on the flexible display.

11. The method of claim 1, wherein the one or more flexibility constraints include a maximum amount of strain corresponding to a layer of the flexible electronics component.

12. A flexible electronics assembly comprising:
    a flexible electronics component; and
    a support structure component fixedly adhered to the flexible electronics component to constrain flexing of the flexible electronics component to within one or more flexing boundaries so as to prevent damage to one or more critical layers of the flexible electronics display,
    wherein the support structure component is adhered to the flexible electronics component by:
      bending the flexible electronics component to be aligned with a curved contour, the curved contour determined based on a flexibility requirement of a product in which the flexible electronics is to be integrated and based on the one or more flexing boundaries;
      bending the support structure component to be aligned with the curved contour; and
      adhering the bent flexible electronics component to the bent support structure component to produce the flexible electronics assembly.

13. The flexible electronics assembly of claim 12, further comprising one or more interlayer components disposed between the flexible electronics component and the support structure component to couple at least some portions of the flexible electronics component to corresponding portions of the support structure component.

14. The flexible electronics assembly of claim 12, further comprising an electronics module electrically coupled to the flexible electronics component to cause the flexible electronics component to display images on a flexible display of the flexible electronics component.

15. The flexible electronics assembly of claim 12, wherein the curved contour is determined based on the flexibility requirement of the product in which the flexible display is to be integrated and is determined so as to produce a magnitude of tension in the flexible electronics assembly in a flat state that is near equal to a magnitude of the compression in a flexed state of the flexible electronics assembly.

16. The flexible electronics assembly of claim 12, wherein the flexible electronics component includes a flexible display, the flexible display including:
   one or more substrate layers,
   one or more brittle inorganic layers,
   an electro-optical layer including a plurality of electrically energizable elements disposed between the one or more substrate layers and the one or more brittle inorganic layers, and
   a driving electronics layer including a plurality of electrically energizing elements disposed between the one or more substrate layers and the one or more brittle inorganic layers.

17. The flexible electronics assembly of claim 12, wherein the curved contour includes a curved segment and a flat segment, and wherein bending the flexible electronics component to be aligned with the curved contour includes:
   bending a first zone of the flexible electronics component to be aligned with the curved segment of the curved contour, and
   bending a second zone of the flexible electronics component different from the first zone of the flexible electronics component to be aligned with the flat segment of the curved contour.

18. The flexible electronics assembly of claim 12, wherein the curved contour includes a radius of curvature larger than a specified radius of curvature, R, indicated in the flexibility requirement of the product.

19. The flexible electronics assembly of claim 18, wherein the radius of curvature is twice as large as the specified radius of curvature.

20. The flexible electronics assembly of claim 18, wherein the radius of curvature is one of:
   (i) larger than 2R to compensate for built-in asymmetry of the flexible electronics component, or
   (ii) smaller than 2R to compensate for relaxation of the flexible electronics component.

* * * * *